(12) United States Patent
De Cea Falco et al.

(10) Patent No.: US 11,650,440 B1
(45) Date of Patent: May 16, 2023

(54) PHOTOVOLTAIC OPTICAL MODULATORS

(71) Applicant: Massachusetts Institute of Technology, Cambridge, MA (US)

(72) Inventors: Marc De Cea Falco, Cambridge, MA (US); Amir H. Atabaki, San Francisco, CA (US); Rajeev J. Ram, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 138 days.

(21) Appl. No.: 17/353,081

(22) Filed: Jun. 21, 2021

Related U.S. Application Data

(60) Provisional application No. 63/066,862, filed on Aug. 18, 2020.

(51) Int. Cl.
*G02F 1/025* (2006.01)
*G02F 1/225* (2006.01)
*H01L 31/0745* (2012.01)

(52) U.S. Cl.
CPC ........... *G02F 1/025* (2013.01); *G02F 1/2257* (2013.01); *H01L 31/0745* (2013.01)

(58) Field of Classification Search
CPC ..... G02F 1/025; G02F 1/2257; H01L 31/0745
See application file for complete search history.

(56) References Cited

U.S. PATENT DOCUMENTS 10,678,115 B2 * 6/2020 Yu .................. G02F 1/2257

OTHER PUBLICATIONS

Alloatti et al., "Resonance-enhanced waveguide-coupled silicon-germanium detector." Applied Physics Letters 108.7 (2016): 071105. 4 pages.
Fathpour et al., "Energy harvesting in silicon optical modulators." Optics express 14.22 (2006): 10795-10799.
Gil-Molina et al., "Optical free-carrier generation in silicon nano-waveguides at 1550 nm." Applied Physics Letters 112.25 (2018): 251104. 6 pages.
Grillanda et al., "Light-induced metal-like surface of silicon photonic waveguides." Nature communications 6.1 (2015): 1-6.
Hong et al., "Photovoltaic spatial light modulator." Journal of applied physics 69.5 (1991): 2835-2840.
Li et al., "Characterization of surface-state absorption in foundry-fabricated silicon ridge waveguides at 1550 nm using photocurrents." 2016 Conference on Lasers and Electro-Optics (CLEO). IEEE, 2016. 2 pages.
Miller, "Attojoule optoelectronics for low-energy information processing and communications." Journal of Lightwave Technology 35.3 (2017): 346-396.
Miller, "Energy consumption in optical modulators for interconnects." Optics express 20.102 (2012): A293-A308.

* cited by examiner

*Primary Examiner* — John Bedtelyon
(74) *Attorney, Agent, or Firm* — Smith Baluch LLP

(57) ABSTRACT

A photovoltaic modulator utilizes free carriers generated by absorption of optical radiation passing through the modulator to achieve ultra-low energy modulation of the radiation. The photovoltaic modulator can also function as an electro-optic transducer for low-power, low-EMI, high-density sensing applications.

21 Claims, 15 Drawing Sheets

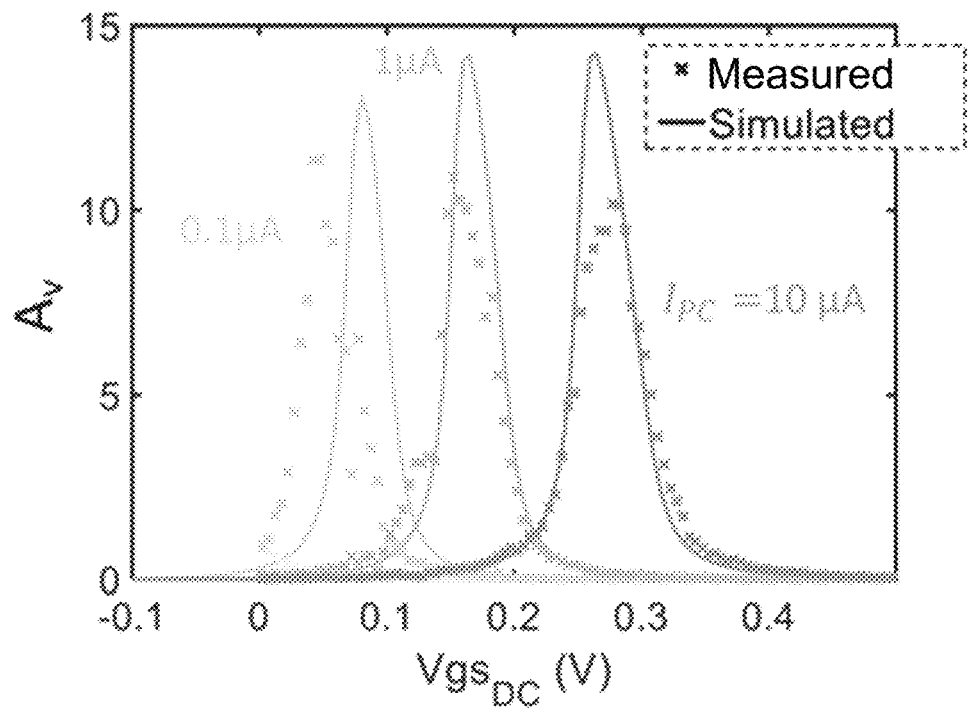
FIG. 8A
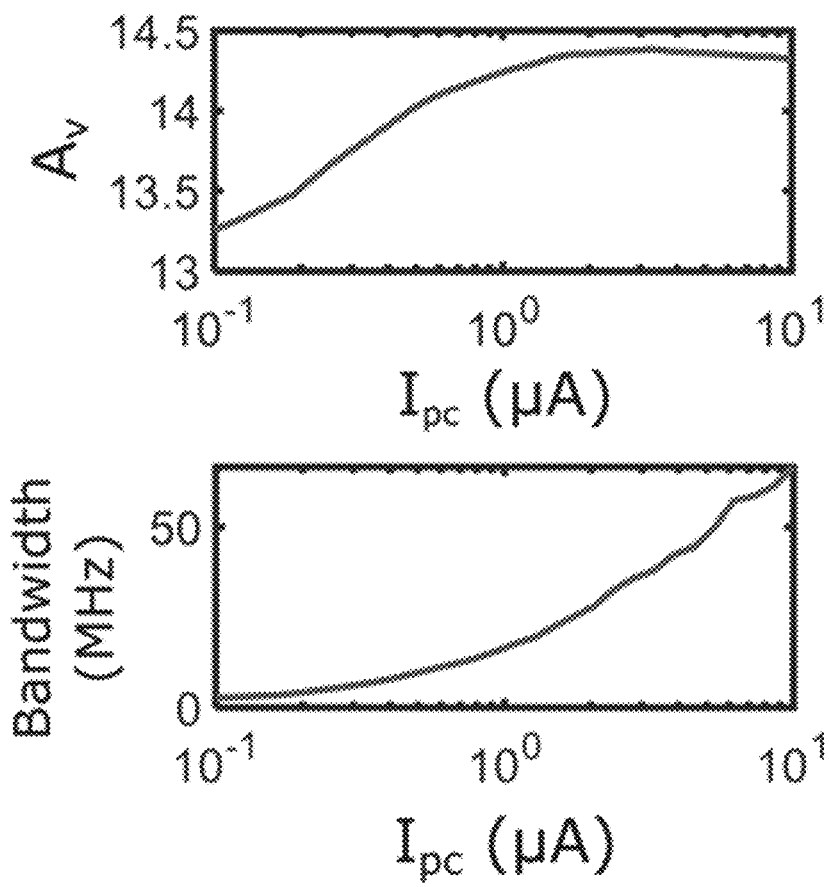
FIG. 8B
FIG. 8C

PHOTOVOLTAIC OPTICAL MODULATORS

CROSS-REFERENCE TO RELATED APPLICATIONS

This application claims a priority benefit, under 35 U.S.C. § 119(e), of U.S. Application No. 63/066,862, filed on Aug. 18, 2020 titled, "Photovoltaic Optical Modulators," which is incorporated herein by reference in its entirety.

STATEMENT OF GOVERNMENT SUPPORT

This invention was made with government support under HR0011-11-C-0100 awarded by the Defense Advanced Research Projects Agency, and W911NF-19-2-0114 awarded by the U.S. Army Research Office. The government has certain rights in the invention.

BACKGROUND

Semiconductor optical modulators are used to encode signals onto optical carrier waves at high speeds (over 1 Gbit/sec). Most, if not all, optical modulators developed to date—on silicon and other materials—work by delivering external electrical current and charge to the electrodes of the modulator. For some modulators, the current is applied to semiconductor junctions that generate free carriers in a region of the modulator through which the carrier wave passes. The change in free-carrier concentration causes a change in the refractive index which modulates the phase and/or intensity of the carrier wave.

High-performance integrated silicon modulators can operate at speeds well over 10 Gb/sec. However, their electrical energy consumption has been limited to values near or above 1 fJ/bit, dominated by the need for large driving voltages (>500 mV$_{pp}$) to address a relatively weak electro-optic effect in silicon. To reduce the amount of energy that a modulator consumes, optical modulators have been realized in materials other than silicon, such as lithium niobate and organic polymers. While improvements in terms of electrical energy dissipation have been achieved, typical energy consumption remains in the fJ/bit range. Additionally, such approaches suffer either from limited scalability, high optical losses, or difficulty of integration with common semiconductor electronics.

SUMMARY

The light input to a semiconductor optical modulator can constitute an electrical energy supply (from a photogenerated current) through the photovoltaic effect. This energy supply has been unexploited in conventional modulators. As described herein, photogenerated free carriers produced by absorption of some of the input light can be used to self-charge a photovoltaic modulator or photovoltaic electro-optic transducer. A single control transistor can be sufficient for modulating the stored charge in the photovoltaic device to modulate the input light. With such a configuration, the electrical driver for the modulator only needs to charge the nano-scale gate of the control transistor, which can exhibit attojoule-scale energy dissipation or less. Accordingly, a silicon photovoltaic modulator with sub-aJ/bit electrical energy consumption that operates at sub-GHz speeds can be realized. Close integration and co-design of electronics and photonics for a photovoltaic modulator may provide optical switching with as few as 500 injected electrons and electrical energy consumption as low as 20 zJ/bit. The photovoltaic modulator and its controlling transistor can be implemented with a monolithic CMOS platform, taking advantage of mature microfabrication technologies. Such photovoltaic modulators or photovoltaic electro-optic transducers can be useful for a variety of applications including low-energy optical communications and massively parallel input/output systems such as neural interfaces.

Some implementations relate to an electro-optic transducer comprising a first waveguide section to receive optical radiation and one or more semiconductor junctions formed along a second waveguide section to modulate the optical radiation. The second waveguide section is optically coupled to the first waveguide section and each semiconductor junction comprises a first region of n-type semiconductor material and a second region of p-type semiconductor material. Further, the optical radiation, when received, generates an amount of free carriers in the second waveguide section that is a majority of a total amount of free carriers provided to the second waveguide section to modulate the optical radiation.

Some implementations relate to a photovoltaic optical modulator comprising a first waveguide section to receive optical radiation, one or more semiconductor junctions formed along a second waveguide section to modulate the optical radiation, and a transistor having a control terminal and current-carrying terminals that are connected in parallel to the one or more semiconductor junctions. The second waveguide section is optically coupled to the first waveguide section and each semiconductor junction comprises a first region of n-type semiconductor material and a second region of p-type semiconductor material. Additionally, the optical radiation, when received, generates an amount of free carriers in the second waveguide section that is a majority of a total amount of free carriers provided to the second waveguide section to modulate the optical radiation. The current-carrying terminals of the transistor are configured to switch the transistor between providing a short circuit and providing an open circuit between the first region of n-type semiconductor material and the second region of p-type semiconductor material dependent upon a signal applied to the control terminal of the transistor. A total capacitance due to interconnection between the current-carrying terminals and the semiconductor junctions may be less than or equal to 2 fF.

Some implementations relate to a method of modulating optical radiation. The method can include acts of receiving the optical radiation in a first waveguide section; coupling radiation from the first waveguide section to a second waveguide section, the second waveguide section having one or more semiconductor junctions formed in the second waveguide section, wherein each semiconductor junction comprises a first region of n-type semiconductor material and a second region of p-type semiconductor material; and receiving, in the second waveguide section, an amount of free carriers that is generated by the optical radiation in the second waveguide section, wherein the amount of free carriers is a majority of a total amount of free carriers provided to the second waveguide section to modulate the optical radiation.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar components).

Figure 6:
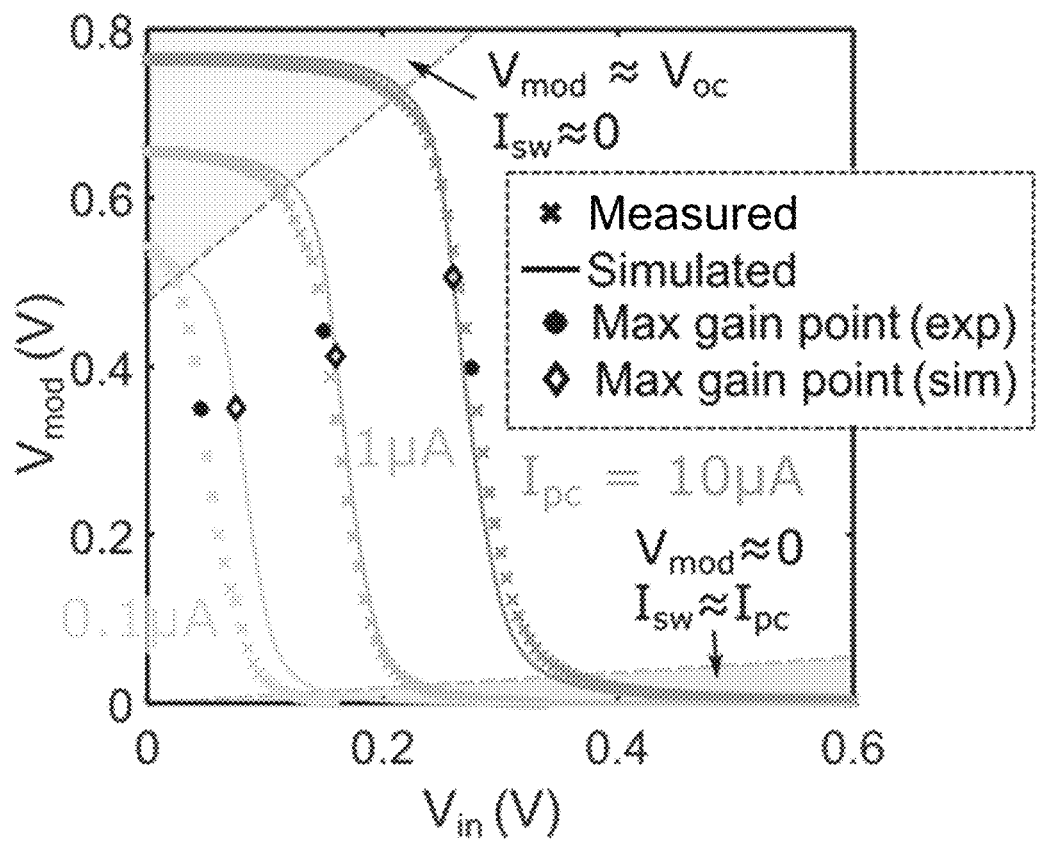

FIG. 6 plots the voltage across the photovoltaic modulator's terminals as a function of voltage applied to the control terminal of modulator's control transistor 120.

Figure 2:
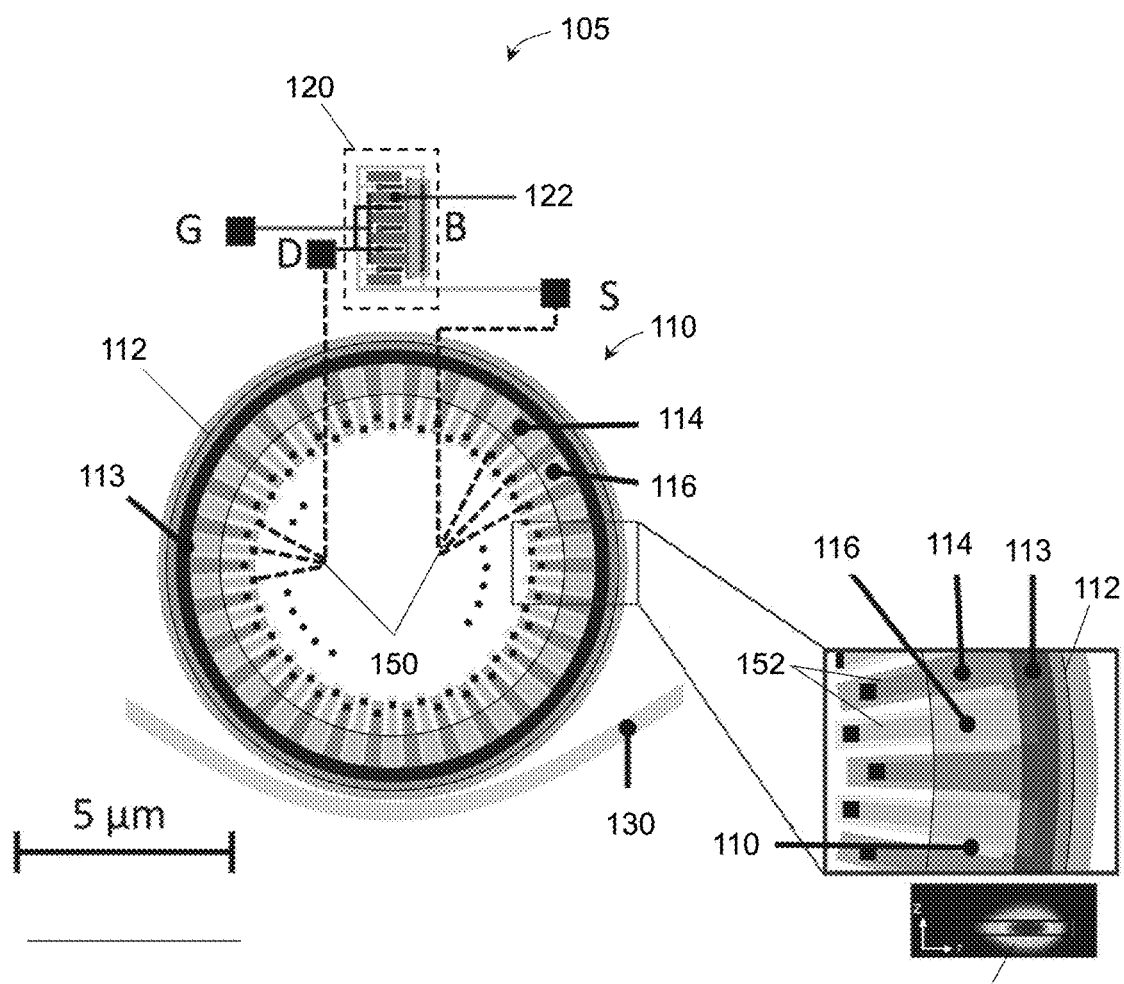
FIG. 2 depicts further details of the photovoltaic modulator of FIG. 1.
Figure 7:
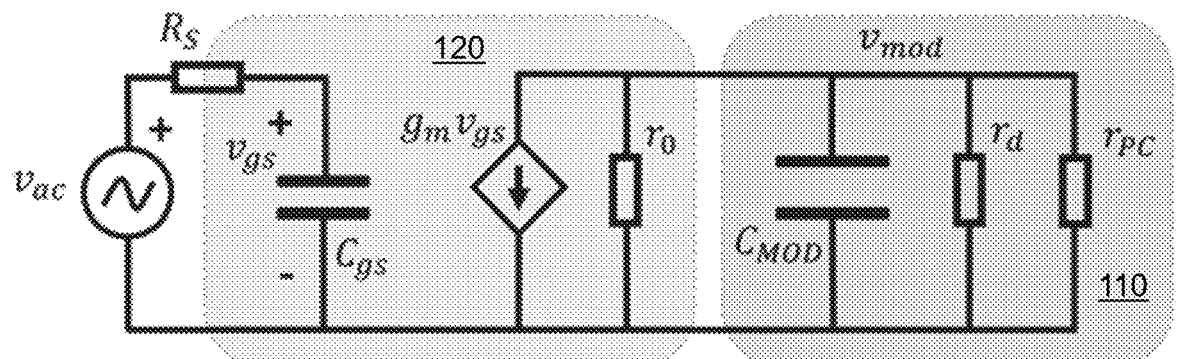

FIG. 7 is a small-signal circuit model for the photovoltaic modulator of FIG. 2.

FIG. 8A plots electrical gain as a function of gate-to-source voltage on the modulator's control transistor 120 for the photovoltaic modulator of FIG. 2.

FIG. 8B plots simulated maximum gain as a function of photogenerated current $I_{pc}$ for the photovoltaic modulator of FIG. 2.

FIG. 8C plots simulated 3 dB bandwidth as a function of photogenerated current $I_{pc}$ for the photovoltaic modulator of FIG. 2 when the modulator's control transistor is biased to provide a highest gain $A_v$.

Figure 8D:
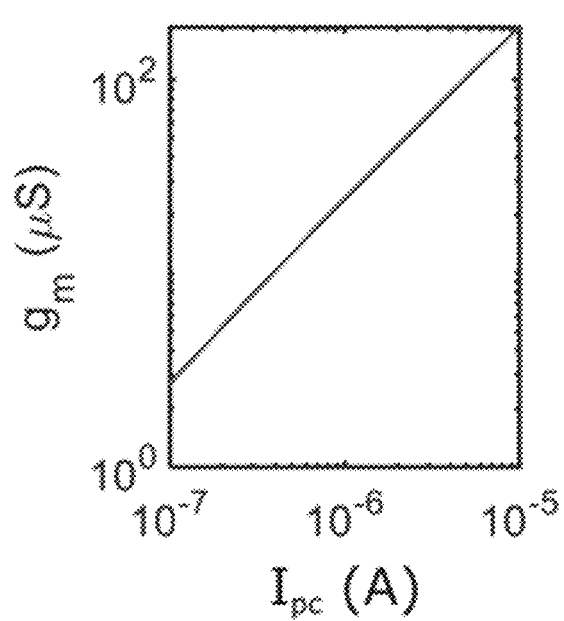

FIG. 8D plots simulated transconductance of the modulator's control transistor as a function of photogenerated current $I_{pc}$ for the photovoltaic modulator of FIG. 2 when the modulator's control transistor is biased to provide a highest gain $A_v$.

Figure 8E:
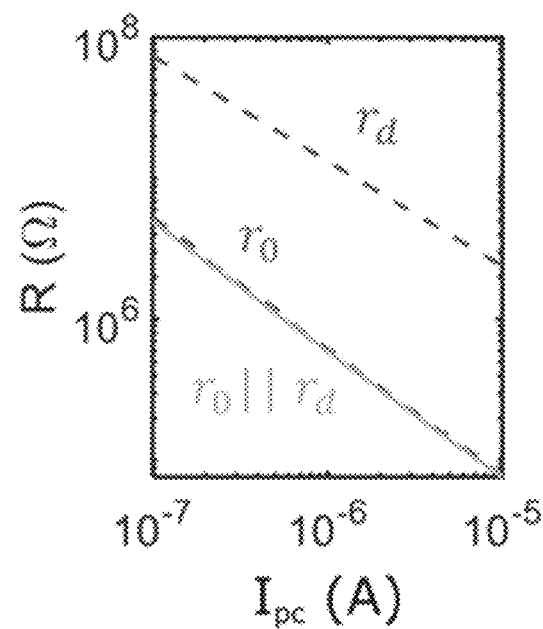

FIG. 8E plots system resistance as a function of photogenerated current $I_{pc}$ for the photovoltaic modulator of FIG. 2 when the modulator's control transistor is biased to provide a highest gain $A_v$.

Figure 8F:
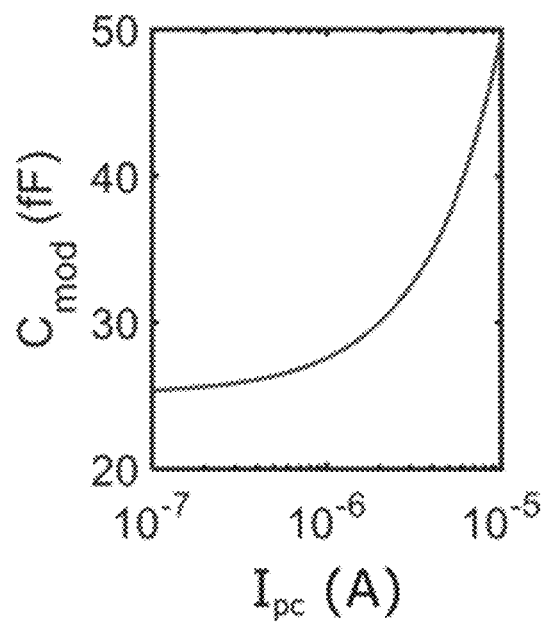

FIG. 8F plots modulator capacitance as a function of photogenerated current $I_{pc}$ for the photovoltaic modulator of FIG. 2 when the modulator's control transistor is biased to provide a highest gain $A_v$.

Figure 9A:
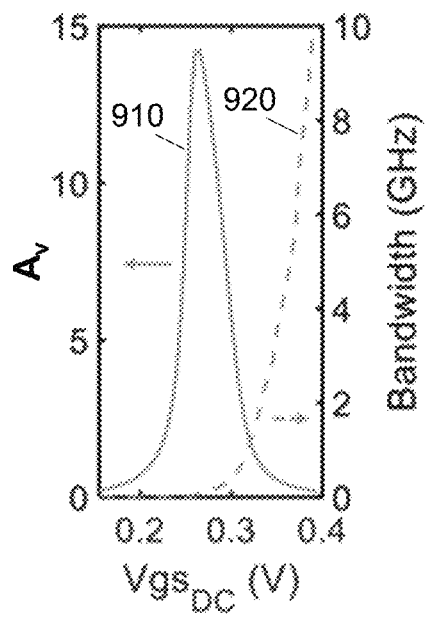

FIG. 9A co-plots simulated small-signal gain (left axis) and bandwidth (right axis) as a function of gate-to-source voltage on the modulator's control transistor 120 for the photovoltaic modulator of FIG. 2.

Figure 9B:
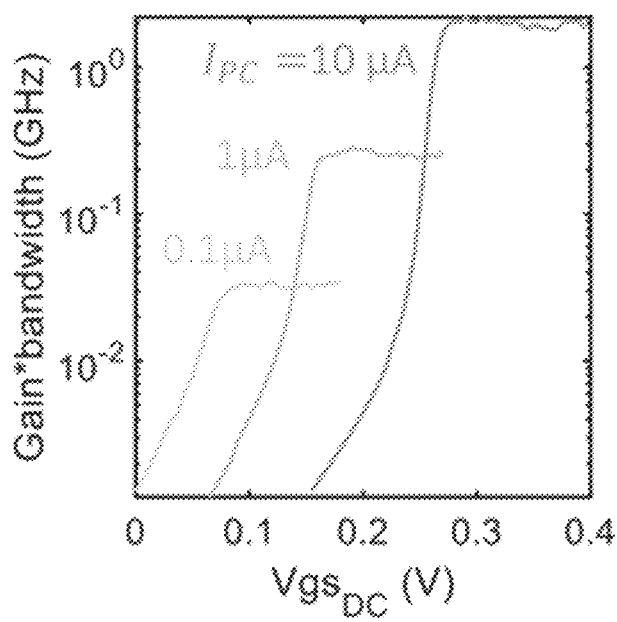

FIG. 9B plots the simulated product of DC gain and bandwidth (for three values of photocurrent) as a function of gate-to-source voltage on the modulator's control transistor 120 for the photovoltaic modulator of FIG. 2.

Figure 9C:
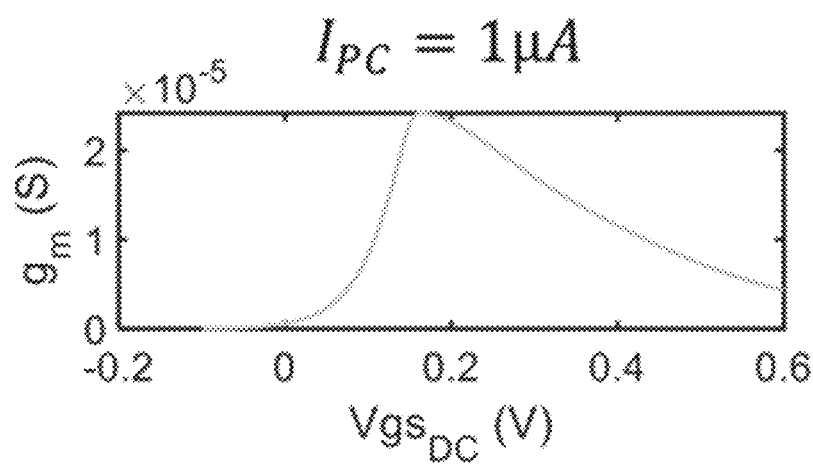

FIG. 9C plots simulated transconductance of the modulator's control transistor as a function of gate-to-source voltage on the modulator's control transistor 120 for the photovoltaic modulator of FIG. 2.

Figure 9D:
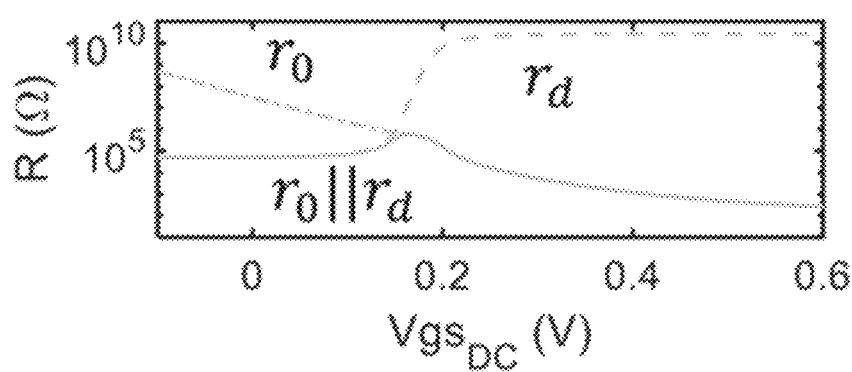

FIG. 9D plots system resistance as a function of gate-to-source voltage on the modulator's control transistor 120 for the photovoltaic modulator of FIG. 2.

Figure 9E:
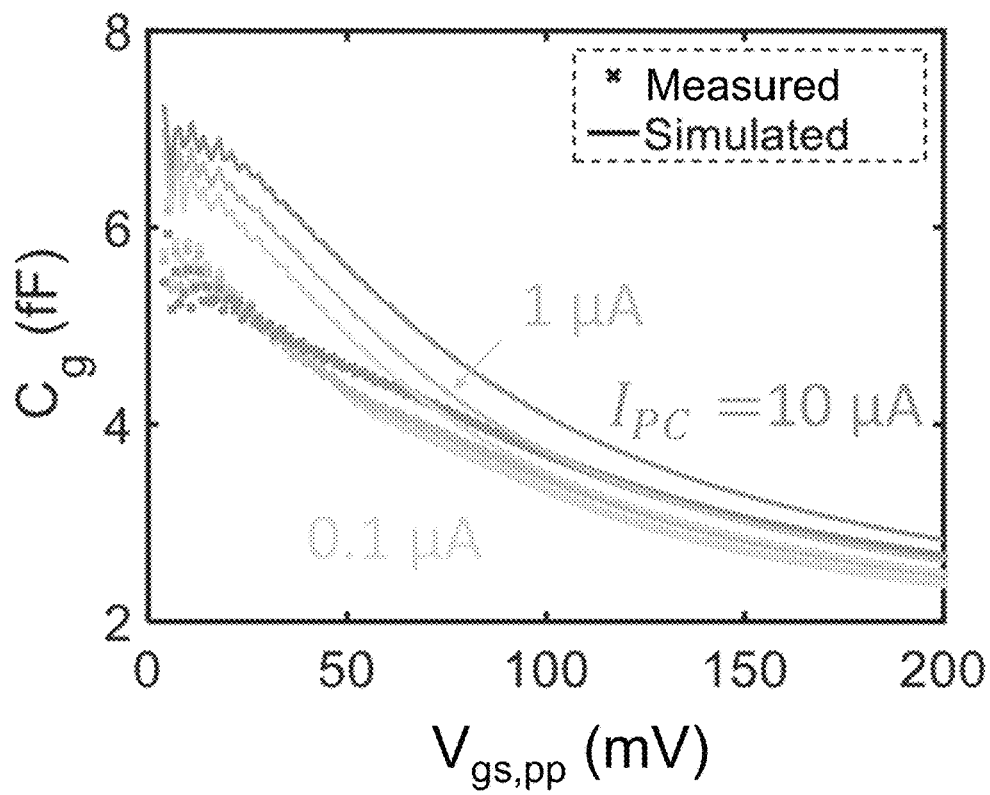

FIG. 9E plots simulated and measured equivalent gate capacitance for the control transistor (accounting for the Miller effect) as a function of gate-to-source voltage on the modulator's control transistor 120 for the photovoltaic modulator of FIG. 2.

Figure 9F:
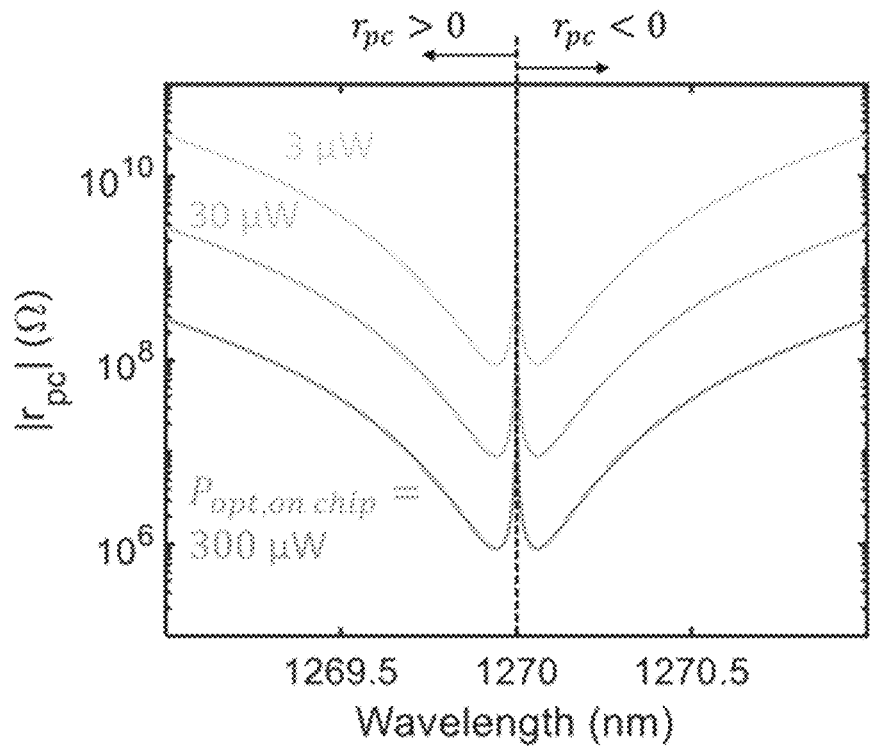

FIG. 9F plots a differential photocurrent resistance as a function of operating wavelength for a photovoltaic modulator.

Figure 9G:
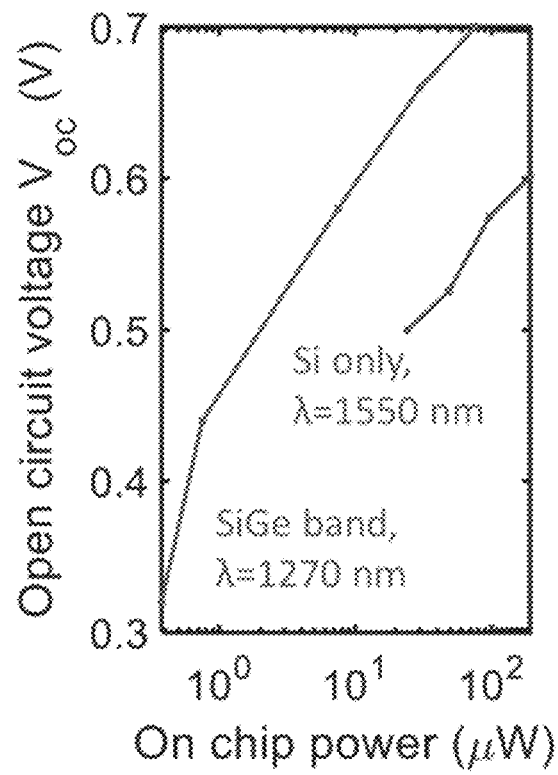

FIG. 9G plots open circuit voltage on the photovoltaic modulator's terminals as a function of input optical power for two different modulators.

Figure 9H:
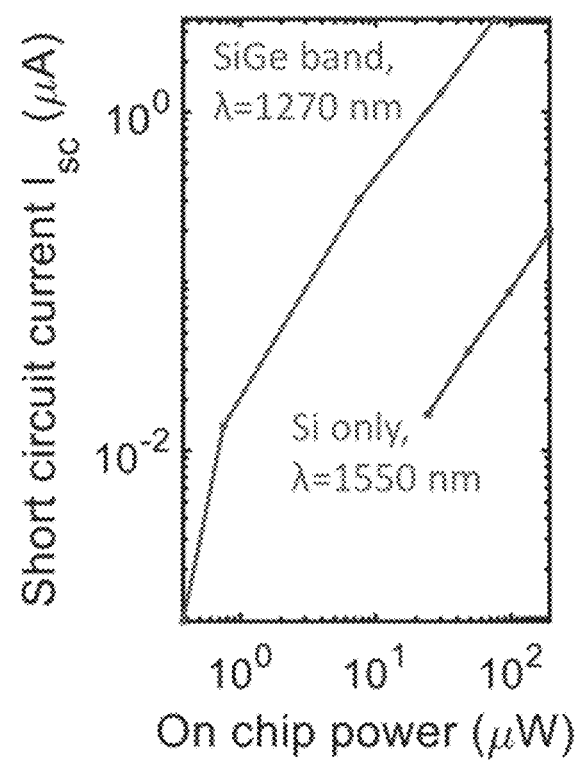

FIG. 9H plots short circuit current between the photovoltaic modulator's terminals as a function of input optical power for two different modulators.

Figure 9I:
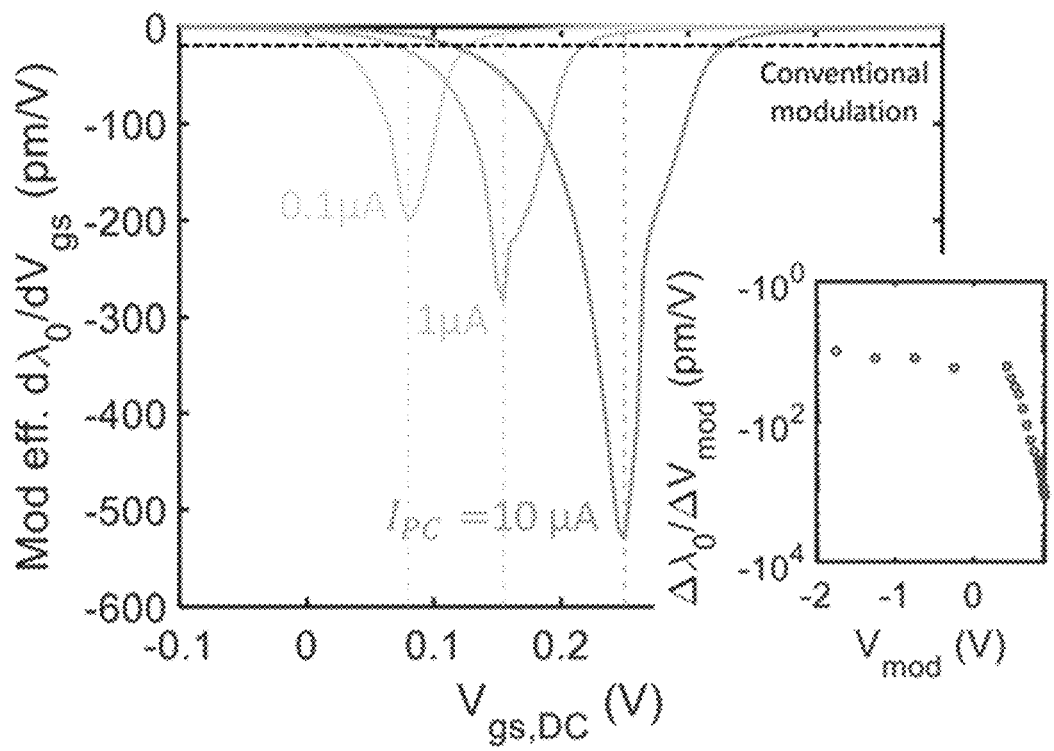

FIG. 9I co-plots modulation efficiency as a function of gate-to-source voltage on the modulator's control transistor and as a function of voltage across the modulator's terminals (inset) for the photovoltaic modulator of FIG. 2.

Figure 9J:
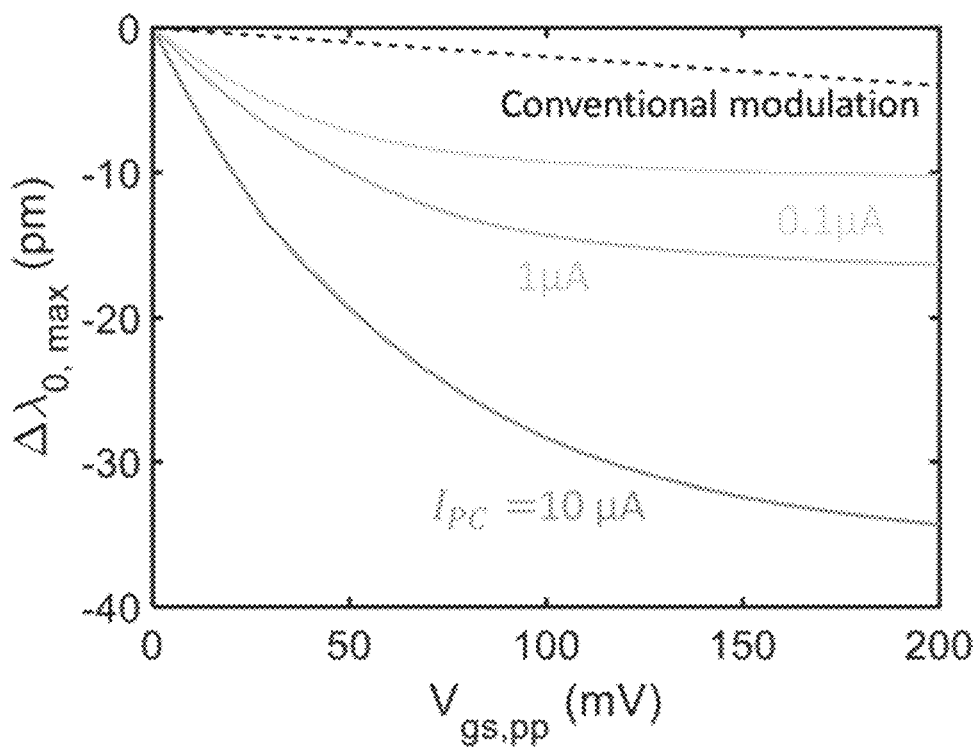

FIG. 9J plots the maximum resonance shift as a function of gate-to-source voltage on the modulator's control transistor for the photovoltaic modulator of FIG. 2 (three values of photocurrent) and for a conventional optical modulator.

FIG. 9K and FIG. 9L are surface plots of extinction ratio as a function of modulator bandwidth and energy consumption per bit for the photovoltaic modulator of FIG. 2.

Figure 9M:
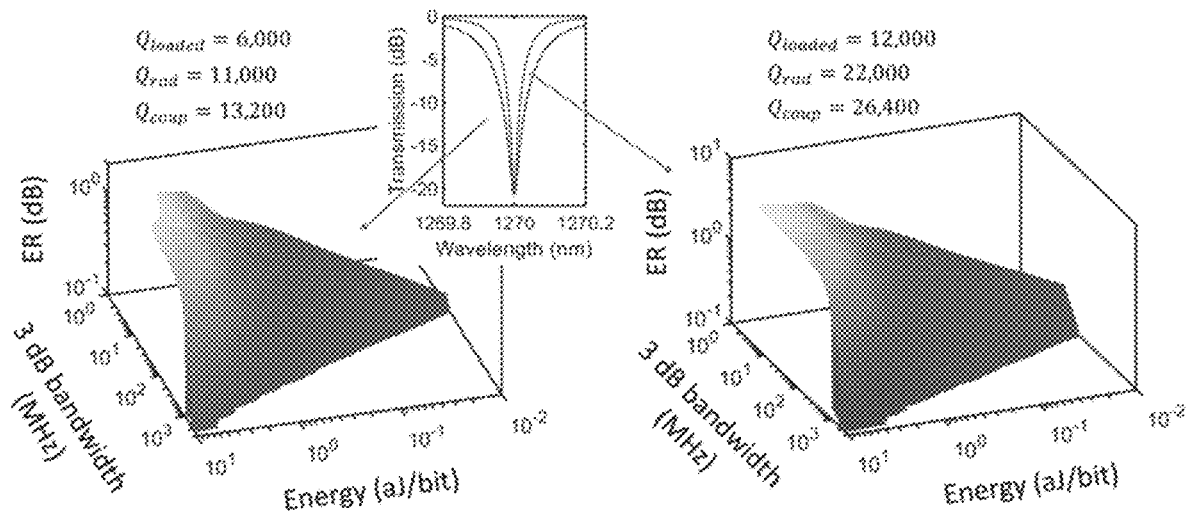
Figure 9M:
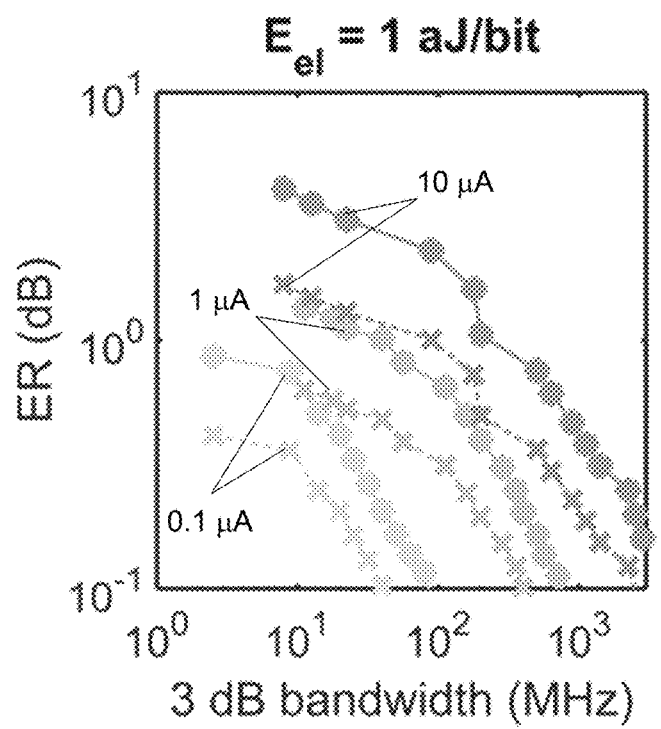

FIG. 9M includes plots corresponding to slices through the surface plots of FIG. 9K and FIG. 9L for an energy consumption of 1 aJ/bit and for different photocurrents.

Figure 10A:
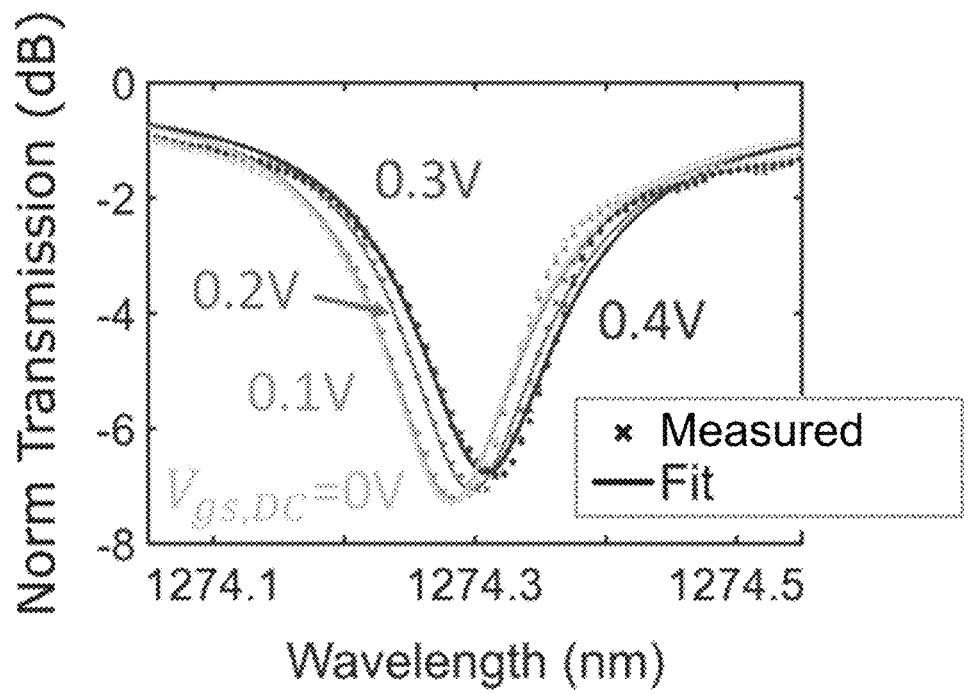

FIG. 10A plots measured and simulated normalized optical response curves for a photovoltaic modulator of FIG. 2 under different operating conditions.

Figure 10B:
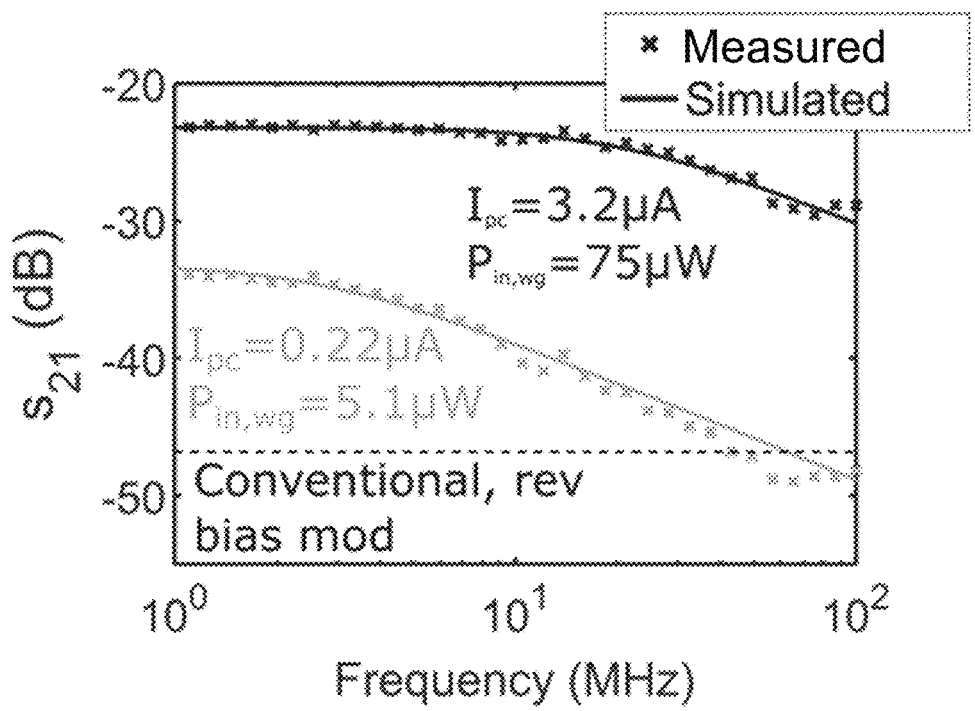

FIG. 10B plots measured and simulated frequency response for a photovoltaic modulator of FIG. 2 under two different operating conditions.

Figure 10C:
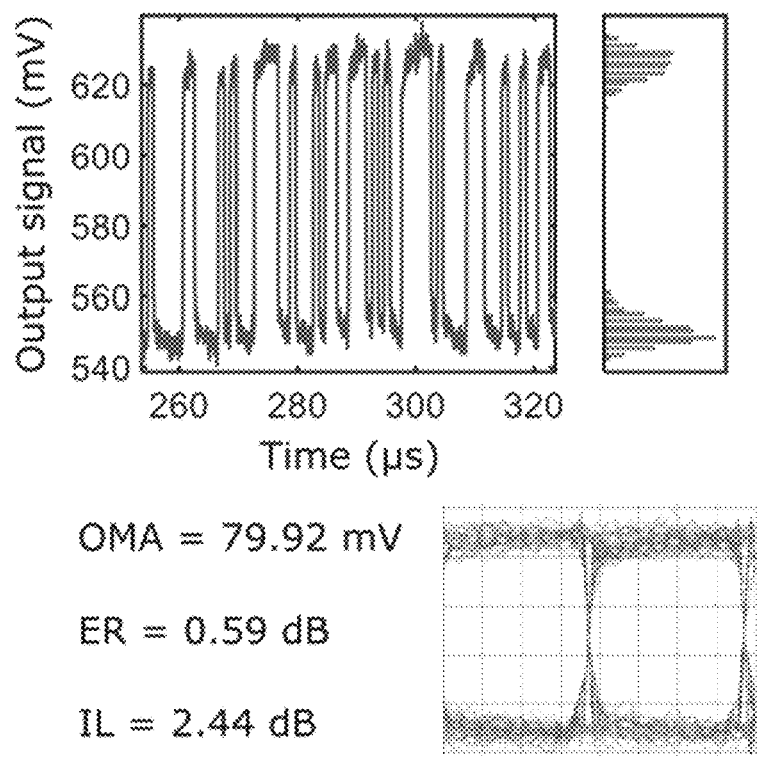

FIG. 10C shows output signal quality for a photovoltaic modulator of FIG. 2 operating at an energy consumption of about 9 attojoules/bit.

Figure 10D:
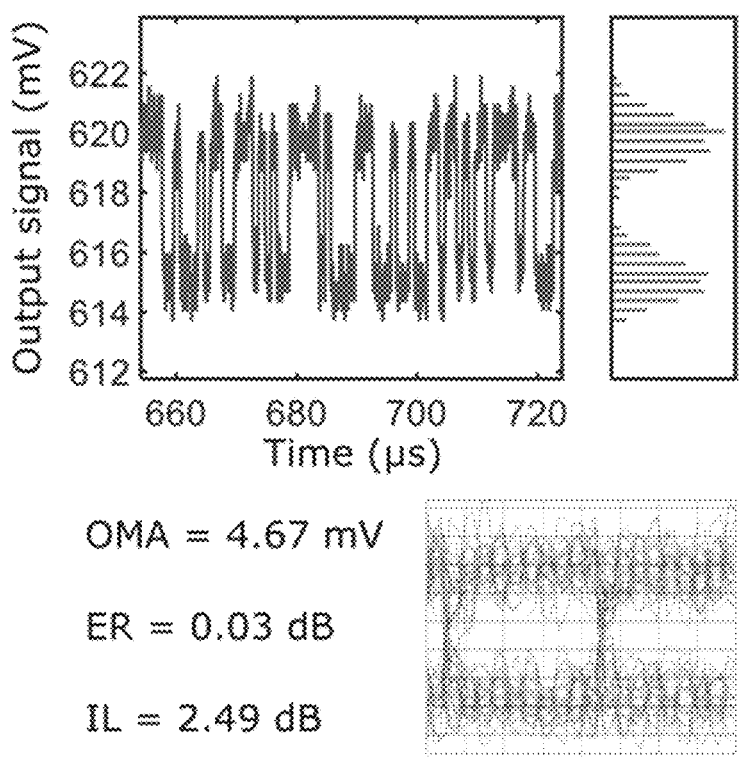

FIG. 10D shows output signal quality for a photovoltaic modulator of FIG. 2 operating at an energy consumption of about 23 zeptojoules/bit.

Figure 11:
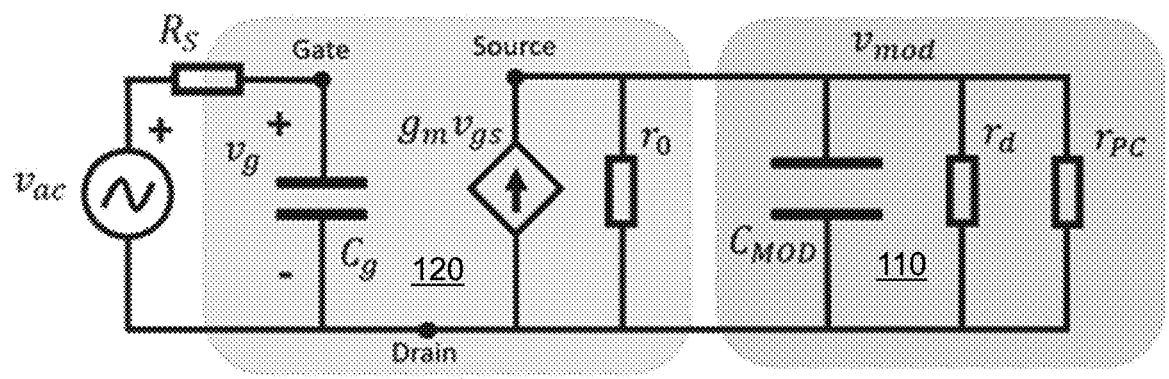

FIG. 11 depicts a small-signal circuit model for a common-drain configured photovoltaic modulator.

Figure 12:
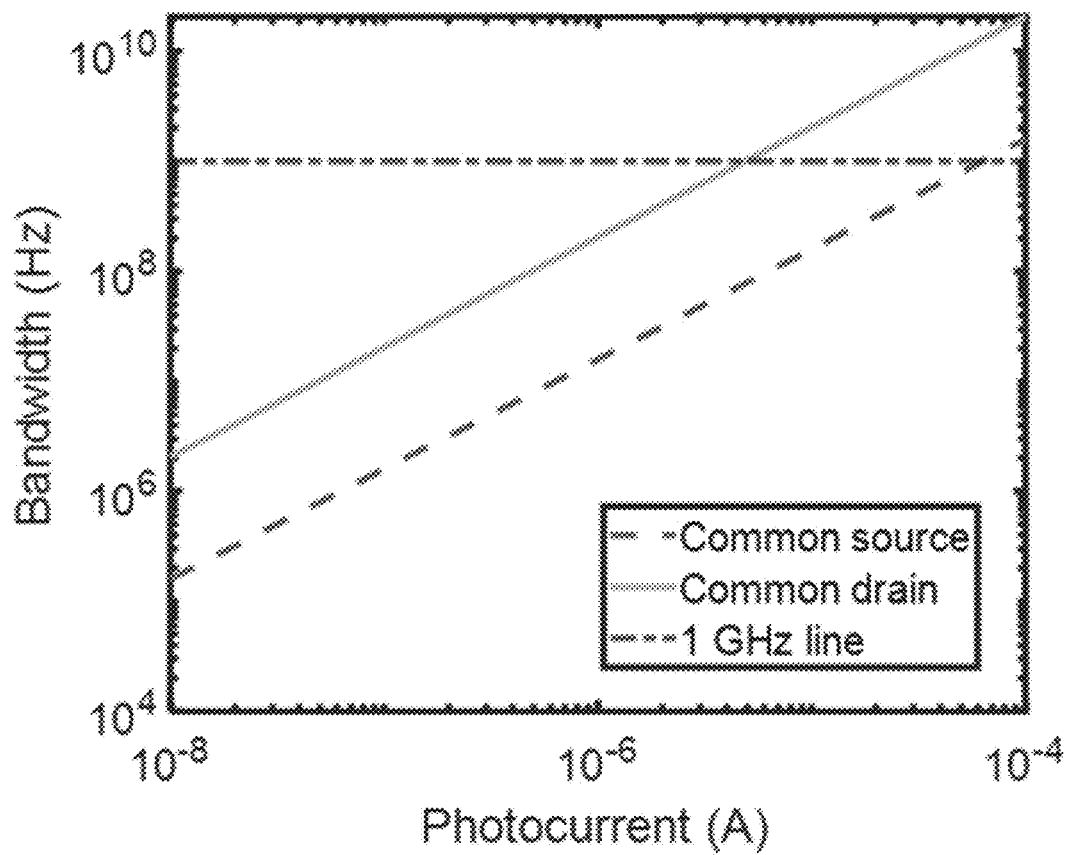

FIG. 12 plots calculated bandwidth as a function of photocurrent for common-source and common-drain configured photovoltaic modulators.

Figure 13:
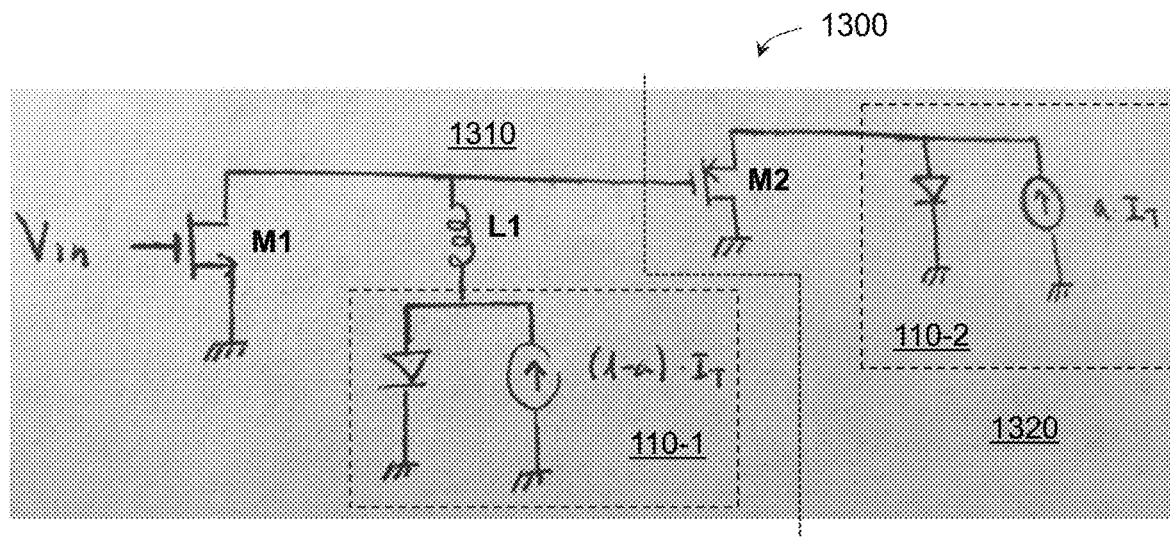

FIG. 13 depicts a circuit model for a two-stage photovoltaic modulator.

Figure 14:
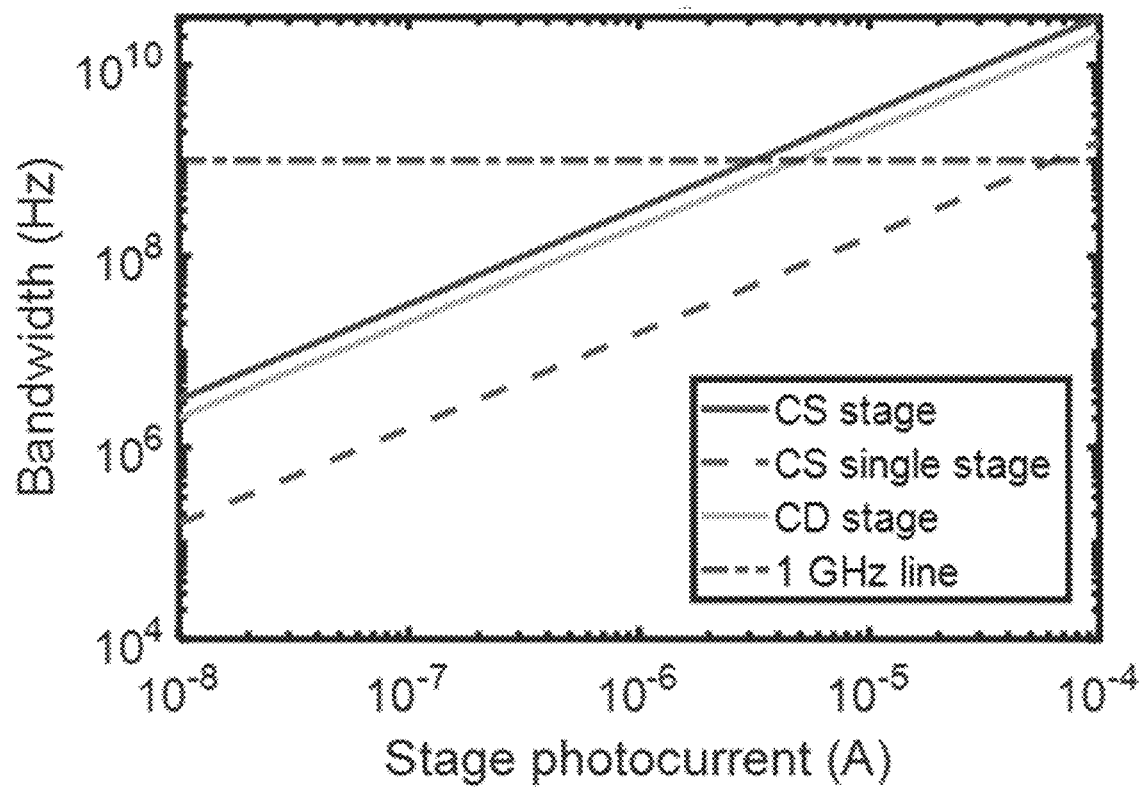

FIG. 14 plots calculated bandwidth as a function of photocurrent for common-source and common-drain stages of the two-stage photovoltaic modulator circuit in FIG. 13.

DETAILED DESCRIPTION

Low-energy optical interconnection and low-energy signaling can enable improvements in the areas of information processing systems and data communications for data-intensive applications, ranging from large-scale datacenters to high performance computing. Alongside these "traditional" applications, new applications for energy-efficient optical links are emerging, including specialized interconnects for neural interfaces, ultrasound, magnetic resonance imaging (MM), and cryogenic readout of sensors. In all these applications, the distance between the sensing site, where the signal of interest is acquired, and the main processor can range from centimeters to several meters.

A conventional approach to sensing small signals is to use an electrical transducer and electrical interconnects, which can require power-hungry electrical amplification due to the weak nature of the sensed signals. High power consumption can pose a challenge to scaling to massively parallel readout because the electrical energy consumption and/or dissipation at the sensing site may be tightly constrained. For instance, a 2 K increase in the temperature of brain tissue can significantly affect normal brain activity and can severely damage the tissue if sustained over a timescale of hours. Thus, the total power dissipated for an interface may be tightly constrained by the sensing environment (e.g., to about 10 mW for a neural interface). Likewise, the limited cooling power available in the lower temperature stages of cryostats may limit the power dissipation of the readout circuitry to a value from 1 mW to 100 mW depending on the operating temperature of a device of interest in the cryostat.

Other considerations for improved signal sensing include noise and interference in the sensing system. The amplification, sensing, readout, and delivery of electrical signals in magnetic resonance imaging (MM) applications can be challenging due to the electromagnetic interference and induced heating caused by the high magnetic fields present in an MRI chamber.

The use of low-energy photonic sensors and interconnects could offer significant advantages in terms of achievable sensor and interconnect density, power dissipation, and robustness to electromagnetic interference compared to conventional electronics-based solutions. The development of a compact, scalable, low power opto-electronic transducer capable of converting a weak sensed electrical signal into a modulated optical signal with attojoule-scale electrical energy consumption and no need for amplification could enable high-density sensing and optical readout of thousands of devices for the above-mentioned applications. Additionally, optical interconnects for a sensing system can avoid issues related to electromagnetic interference. For some applications, such as electrophysiological sensing, a moderate data rate on the order of 10 Mb/sec to 100 Mb/sec may be the highest data rate needed for system operation.

For an optical modulator, photons are constantly delivered to the modulator. These photons can generate free carriers through various sources of optical absorption—including interfacial and sub-bandgap absorption. The inventors have recognized and appreciated that these photogenerated free carriers can be utilized for modulation of the radiation that produced the free carriers. Utilizing the photogenerated free carriers can eliminate the need for supplying external current and charge to the modulator. This can result in a significant decrease in energy consumed by the modulator and in the energy dissipated to the local environment. The inventors have successfully demonstrated a photovoltaic modulator (also referred to as an electro-optic transducer for sensing applications) that harvests the photogenerated free carriers to modulate radiation passing through the modulator.

Figure 1:
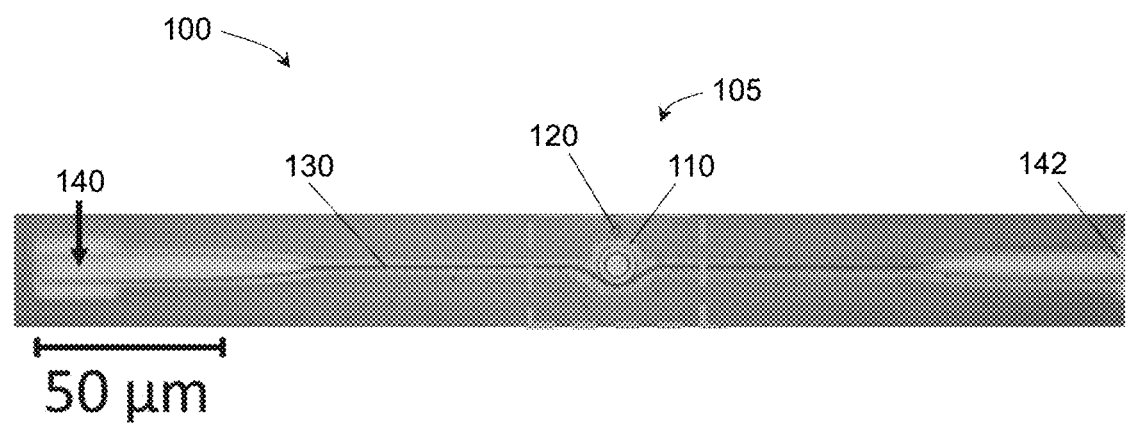
FIG. 1 is a micrograph of a photonic system that includes a photovoltaic modulator.

FIG. 1 is a micrograph of an example photonic system 100 that includes a photovoltaic modulator 105. The system 100 includes a bus waveguide 130 and a grating coupler 140 at an input port that is used to couple optical radiation into the bus waveguide. The bus waveguide 130 delivers the radiation to the photovoltaic modulator 105, where evanescent coupling from the bus waveguide 130 to an optical modulating structure (ring resonator 110 in the illustrated example) occurs. The bus waveguide 130 can have a width (parallel to the sheet of the drawing) from 200 nm to 800 nm and a height (out of the sheet of the drawing) from 50 nm to 400 nm. The bus waveguide 130 can continue past the photovoltaic modulator 105 to an output port 142. The ring resonator 110 (also referred to as a "microring") comprises a second waveguide that is circular in the example device, however the resonator 110 may have other shapes such as oval or racetrack shapes. The bus waveguide 130 and ring resonator 110 can be formed from a semiconductor material, such as silicon. However, other semiconductor materials can be used such as, but not limited to, gallium arsenide and indium phosphide.

In addition to the ring resonator 110, the photovoltaic modulator 105 further includes a transistor 120, which is barely visible in the micrograph. The transistor 120 may be located within 10 microns to 50 microns of a center of the modulator 105 or its ring resonator 110 (e.g., for a high density of photovoltaic electro-optic transducers), though larger distances are possible in some cases. Advantageously, the transistor 120 is fabricated on and located on a same substrate as the modulator's optical components (ring resonator 110, portion of the bus waveguide 130 through which evanescent coupling occurs). The transistor 120 may be within 10 µm of the ring resonator 110. Any suitable substrate comprising a semiconductor material may be used to fabricate the transistor 120 and optical components for the photovoltaic modulator 105. The substrate may be a semiconductor-on-insulator substrate (e.g., silicon-on-insulator), though in some cases a bulk semiconductor substrate may be used.

FIG. 2 depicts further details of the photovoltaic modulator 105 of FIG. 1. A plan view of the photovoltaic modulator 105 is shown at the left and an enlarged portion of the modulator is shown to the right. A plot of the optical mode 118 in the second waveguide 112 is included below the enlarged portion.

The ring resonator 110 comprises a plurality of semiconductor junctions (e.g., p-n or pi-n junctions) formed along the second waveguide 112 (outlined by two solid dark rings). The junctions include n-type regions 114 and p-type regions 116 that extend into the waveguide 112. Electrical contacts to the n-type regions 114 and p-type regions 116 can be made through n-type and p-type fingers 152 that extend inward from the second waveguide 112. Interconnects 150 can make electrical contact to and connection between the n-type and p-type fingers 152 and terminals of the transistor 120.

The second waveguide 112 may or may not be embedded in a dielectric material (such as an oxide or nitride) that has a lower refractive index at the wavelength of radiation passing through the photovoltaic modulator than the semiconductor material from which the second waveguide 112 is formed. In some cases, at least one surface of the second waveguide may be exposed to air. The second waveguide can have a width (parallel to the sheet of the drawing) from 600 nm to 2500 nm and a height (out of the sheet of the drawing) from 50 nm to 300 nm. The height of the second waveguide 112 may be the same as the height of the bus waveguide 130. In some cases, the second waveguide may be a rib waveguide or ridge waveguide. Because of its large width and curved shape, the peak intensity of the optical mode 118 can travel around the ring resonator 110 closer to an outer edge of the resonator than an inner edge, staying away from the lossy fingers 152 and any lossy metal associated with the interconnects 150 and their contacts to the fingers 152. For example, the peak intensity of the optical mode 118 may be located at least or more than half-way across the second waveguide 112 toward an outer edge of the second waveguide. In some cases, a diameter of the ring resonator 110 to the outside edges of the second waveguide may be no larger than 20 microns. In some implementations, the diameter of the ring resonator may be between 5 microns and 50 microns.

To increase absorption of optical radiation and generation of free carriers within the second waveguide 112, an impure region 113 of semiconductor material can be formed along the second waveguide 112. The impure region 113 may include intentional defects (e.g., from ion implants or ion bombardment) and or an impurity atomic species (e.g., germanium in an otherwise silicon waveguide). The impure region 113 can spatially overlap with the location of the peak intensity of the optical mode 118 that travels in the second waveguide 112.

The transistor 120 may be a CMOS field-effect transistor (FET) (as illustrated) or a bipolar junction transistor (BJT), though other types of transistors may be used. In some cases, the transistor 120 may be formed as a linear array of parallel transistor structures with multiple gates G, multiple sources S, and multiple drains D. A body B of the transistor may be connected to the source(s) or emitter(s). A gate length of the transistor(s) may be from 20 nm to 250 nm, though transistors with smaller or larger gate lengths may be used in some cases. Preferably the transistor 120 is formed using a same microfabrication platform (e.g., CMOS foundry) that is used to form the optical components of the photovoltaic modulator 105. An advantage of using a CMOS foundry is that the photovoltaic modulator may be produced in large quantities at low cost. In some implementations, portions of the transistor 120 (e.g., drain, channel, and source regions) and portions of the optical components (e.g., second waveguide 112) may be formed from a same layer of semiconductor material (e.g., from the semiconductor layer of a SOI wafer). Photovoltaic modulators that can be fabricated in a silicon platform can be commercially attractive due to the maturity of silicon microfabrication, scalability, and the possibility of monolithic integration with CMOS electronics.

Depending on the type of transistor 120 (p-MOS or n-MOS) the drain(s) D of the transistor 120 may connect to either the p-type regions of the ring resonator or the n-type regions while the source(s) connect to the opposite type regions. As such, the transistor can provide an effective electrical short between the p-type regions and the n-type regions of the ring resonator 110 when turned on. This short can remove photogenerated free carriers from the second waveguide 112 (ring resonator for the example modulator). By locating the transistor close to and on the same substrate as the optical components of the photovoltaic modulator 105, parasitic capacitances associated with interconnects between the transistor 120 and semiconductor junctions can be reduced (to 5 fF or below) that would otherwise undesirably reduce the speed of the photovoltaic modulator 105.

In operation, radiation couples from the bus waveguide 130 to the second waveguide 112 where the radiation is partially absorbed to generate free carriers that accumulate along the second waveguide, charging the junction capacitance. The coupling region can include a curved portion of the bus waveguide 130 that extends around a portion of the ring resonator 110 to evanescently couple radiation into the ring resonator and improve the optical mode quality within the resonator. When the transistor 120 is off (an open circuit between its current carrying terminals S, D), these free carriers accumulate along the second waveguide 112 and affect the refractive index of the second waveguide. A change in the refractive index affects the phase of an optical wave travelling around the ring resonator 110. Because of optical interference with radiation in the bus waveguide, the amount of generated free carriers affects an amount of radiation that passes to an output port 142 from the photovoltaic modulator. By turning the transistor 120 on (shorting its current-carrying terminals), the accumulated free carriers can recombine and be significantly reduced or cleared along the second waveguide 112, changing an amount of radiation that passes to the output port 142. Accordingly, optical modulation can be achieved by providing only current and energy from an external source sufficient to drive the gate(s) G of the transistor 120 instead of supplying enough current and energy to drive controlling transistors and to forward bias all the semiconductor junctions along the second waveguide 112, as described further below. The amount of energy to drive only the gate(s) G of transistor 120 can be at the attojoule (aJ) level and lower for some configurations. In some cases, the amount of charge needed to drive the transistor 120 can be as low as 500 electrons. The transistor 120 can be the only transistor used to control the photovoltaic modulator 105 and the driving current to operate the photovoltaic modulator can be orders of magnitude less than the driving current and energy needed to operate some conventional modulators.

Figure 3A:
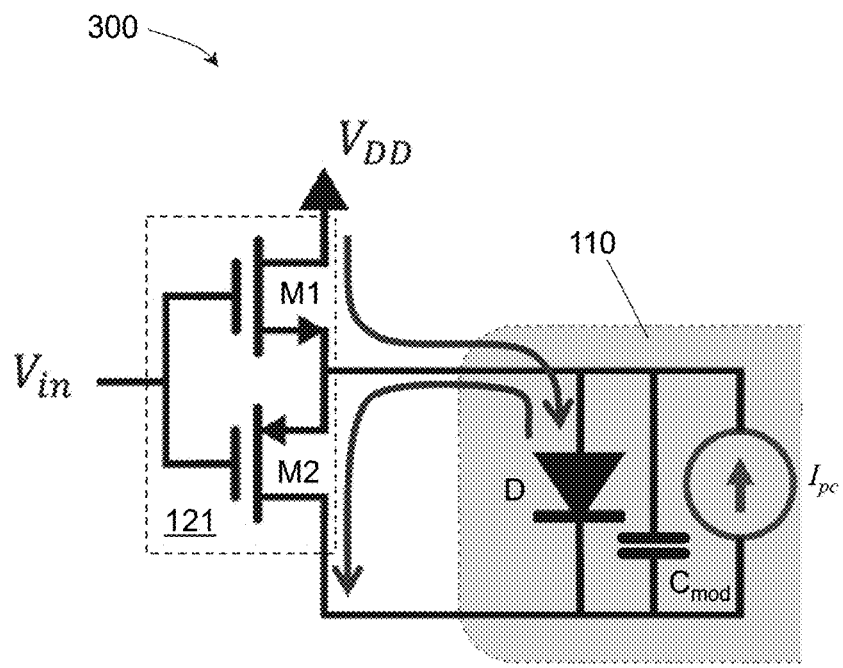
FIG. 3A depicts a circuit model for an optical modulator of the related art.

FIG. 3A depicts a circuit model 300 for an optical modulator of the related art that uses an inverter 121 (transistor pair M1, M2) to inject current and free carriers into the semiconductor junctions (modeled as a single diode D) and to remove the free carriers. The injected current is supplied from a drain supply $V_{DD}$. Every time the input voltage level $V_{in}$ changes, the modulator capacitance $C_{mod}$ is charged by the external source $V_{DD}$ or discharged to ground, dissipating an average energy $E=C_{mod}V_{DD}^2/4$. In addition to the injected current, some current is needed from a driving source $V_{in}$ to drive the gates of the two transistors M1 and M2. Mainly because of the injected current, such conventional devices exhibit minimum energy consumption on the order of 1 femtojoule per bit or higher.

Figure 3B:
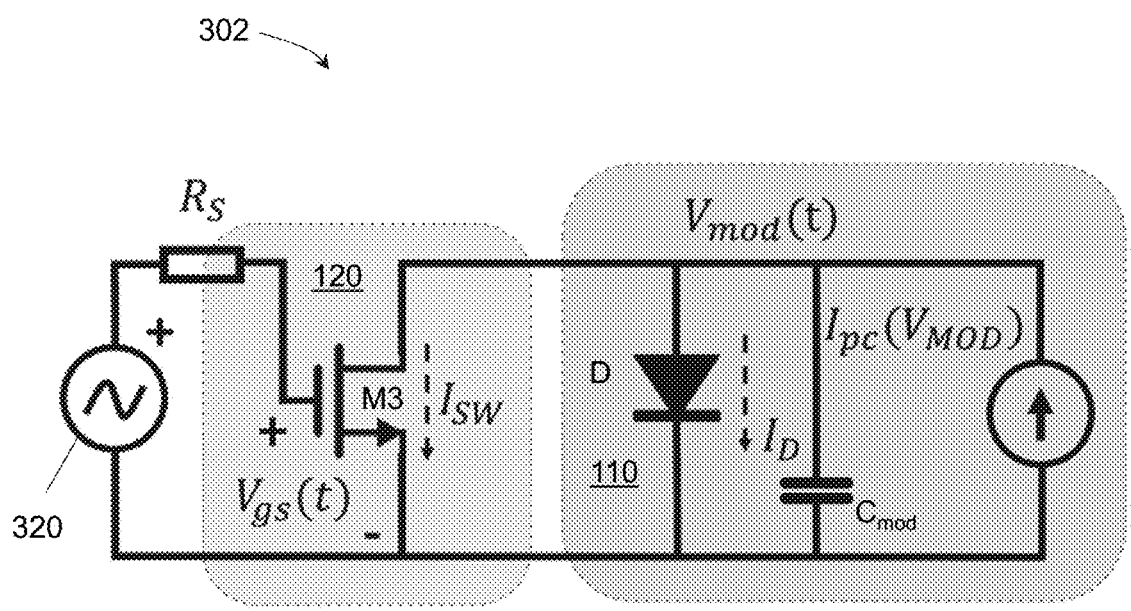
FIG. 3B depicts a circuit model for a photovoltaic modulator of FIG. 2.

FIG. 3B depicts a circuit model 302 for a photovoltaic modulator 105 of FIG. 2 that harvests photocurrent $I_{pc}$ to modulate radiation passing through the modulator. The modulator 105 can be modeled as a single transistor 120 having its current-carrying terminals connected to the n-type regions 114 and p-type regions 116 of the semiconductor junctions of the second waveguide 112. The semiconductor junctions are modeled as a single diode D. In practice, these n-type regions 114 and p-type regions 116 may be connected in parallel to the current-carrying terminals of the transistor 120. A signal source 320 (e.g., a communication signal source, a biophysical signal to be sensed, a signal from a detector in a cryogenic environment) can connect to the gate of the transistor 120 to turn the transistor on and off. There may be a system resistance $R_S$ (modeled in series with the signal source) which is described further below. Turning the transistor 120 on and off through the voltage applied at the transistor's gate or base causes the voltage between the modulator terminals to change between 0 volts (when shunted by the transistor 120) and the open circuit voltage of the modulator $V_{OC}$. Thus, the only electrical energy supplied by the driving source for the photovoltaic modulator can be that associated with the charging and discharging of the gate capacitance of the transistor 120: $E=C_g V_{in\_n}^2/4$. The signal source need only provide enough current to exceed the threshold voltage of the transistor. The energy required to turn the single transistor 120 on can be well below one femtojoule and down to 20 zeptojoules.

In some implementations, the photocurrent $I_{pc}$ produced by the semiconductor junctions is the only current that is used to produce and accumulate free carriers in the optical modulator 105. In other cases, the photocurrent $I_{pc}$ is the majority of current that is used to produce and accumulate free carriers in the optical modulator 105.

Figure 4:
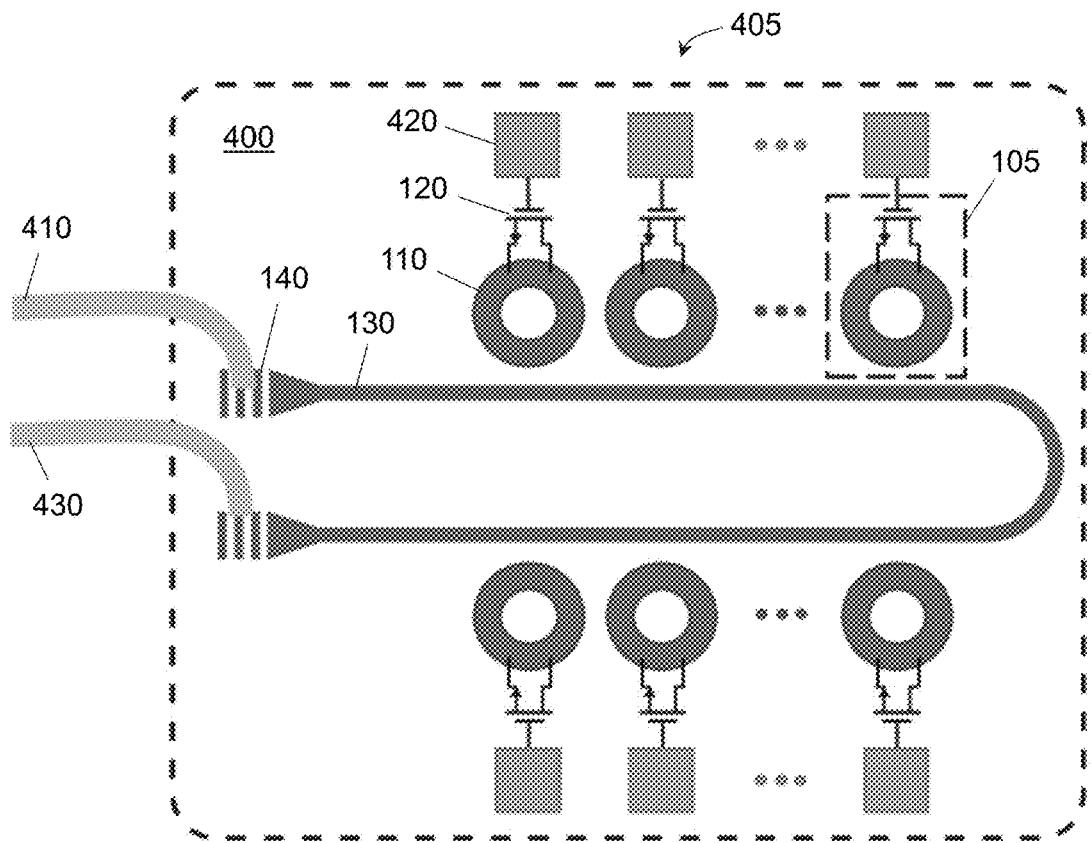
FIG. 4 depicts a sensor array that can include a plurality of photovoltaic electro-optic transducers coupled to a common waveguide.

FIG. 4 depicts an example of a sensor array 400 that can be formed from photovoltaic electro-optic transducers 105 coupled to a common bus waveguide 130. Each sensor 405 can include a photovoltaic electro-optic transducer 105 (also referred to as photovoltaic modulator above) that is connected to a sensing element 420. An output from the sensing element can connect directly (no intervening circuit elements such as amplifiers, capacitors, resistors, inductors, etc.) or indirectly (including at least one intervening circuit element) to a control terminal (gate, base) of the transistor 120. The sensing element 420 may comprise an electrode in some cases (e.g., for detecting biophysical electrical signals) or a transducer in other cases. The transducer may convert energy in some form other than electrical (optical, acoustic, magnetic, thermal, etc.) to an electrical signal that can activate the transistor 120.

Because the photovoltaic electro-optic transducer 105 has a compact size and can be read optically, the sensors 405 can be fabricated in a high-density sensor array 400 where a plurality of the sensors 405 can be addressed and read out with a single bus waveguide 130 using wavelength division multiplexing (WDM) technology. For example, each sensor along a bus waveguide 130 can be tuned (e.g., by selecting a diameter of the ring resonator or thermally biasing the resonator) to operate at a different wavelength. The different wavelengths for the sensors 405 can be multiplexed onto the same input fiber 410 and demultiplexed from the output fiber 430 to separately detect signals for each sensor 405 on the bus waveguide 130. A linear density of the sensors 405 along a same bus waveguide may be from 10 per millimeter to 100 per millimeter, though lower linear densities are possible. A pixel size of a sensor 405 may be as small as 10 microns by 20 microns or another size up to and including 30 microns by 50 microns, though larger sizes are possible. In some cases, the sensing element 420 may be located over 50 microns from the transistor 120. In some implementations, the sensing element 420 may not be located on a same substrate as the transistor 120 and ring resonator 110.

Such compact, low-energy, sensing arrays 400 can be beneficial for sensing applications where the electrical energy at the sensing site is constrained. Example applications include massively-parallel readout of electrophysiological signals (e.g., each sensing element 420 may be an electrode that can be implanted in or attached to tissue), readout of single-photon sensors operating at cryogenic temperatures (e.g., each sensing element 420 may be a single-photon detector located in a cryostat), and readout of electrical signals in environments with high electromagnetic interference such as in magnetic resonance imaging (MRI) (e.g., each sensing element 420 may be a receive RF coil in an MM system).

Figure 5:
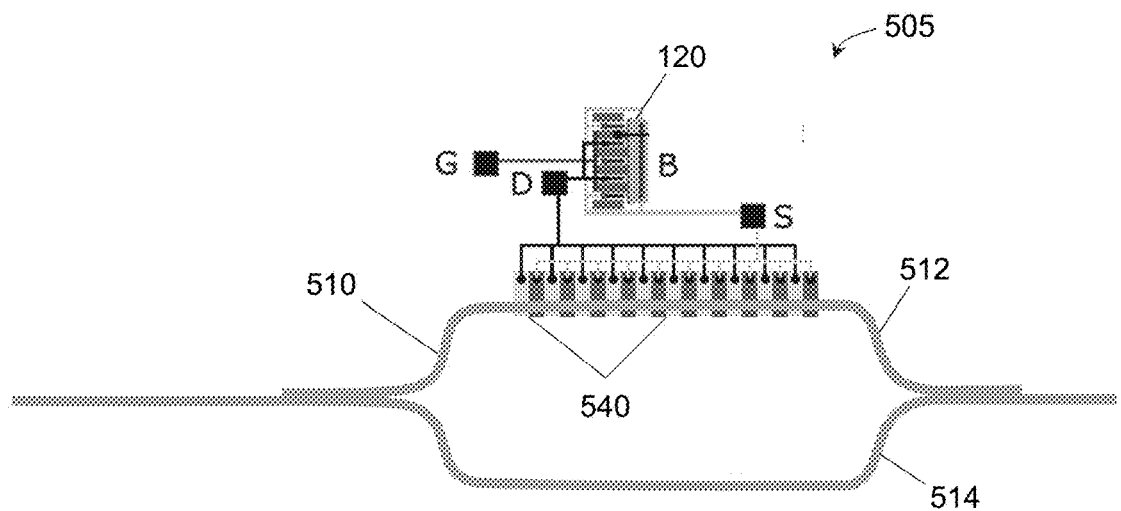
FIG. 5 depicts a photovoltaic modulator that includes a Mach-Zehnder interferometer.

Although the above examples describe a photovoltaic modulator and electro-optic transducer having a ring resonator, the devices may be implemented with other types of optical modulation elements. For example, a microdisk resonator may be used in place of a ring resonator. FIG. 5 depicts an example photovoltaic modulator and transducer 505 that includes a Mach-Zehnder interferometer 510 and transistor 120. The transistor is coupled to semiconductor junctions 540 along a waveguide of the Mach-Zehnder interferometer 510. In practice, the semiconductor junctions 540 may be located along either or both of the interferometer's waveguide arms 512, 514. Further details relating to design, operation, and performance of photovoltaic modulators are described below.

Referring again to FIG. 3B, a large-signal circuit model for the photovoltaic modulator 105 comprises a diode D connected between current-carrying terminals of a transistor 120. Simulated (solid lines) and measured (crosses) DC operating characteristics are plotted in FIG. 6 and show good agreement. Three plots are generated for different values of photocurrent $I_{pc}$ spanning two orders of magnitude. Each plot shows the voltage across the modulator terminals $V_{mod}$ (which may be measured between the current carrying terminals of the transistor 120) as a function of input voltage $V_{in}$ to the transistor. For low input voltages $V_{in}$ (sub-threshold gate-to-source voltage $I_{gs}$ at the transistor 120) the transistor is off (in a low-conduction state such that $I_{SW} \approx 0$, where $I_{SW}$ is the current flowing between the current-carrying terminals of the transistor 120) and the voltage at the modulator $V_{mod}$ is the open circuit voltage $V_{OC}$ of the photovoltaic modulator. As $V_{in}$ rises, the transistor turns on and when $V_{gs} > V_{th}$ all the photocurrent flows through it, resulting in $V_{mod} \approx 0$.

The nonlinear electrical characteristic of the transistor results in the transition from the on-state to the off-state occurring rapidly for a narrow range of $V_{in}$. Therefore, a small change in input voltage results in a large change in $V_{mod}$. This increased sensitivity translates into an increase in modulation efficiency and can be explained as signal gain associated with a common source transistor amplifier.

A small-signal equivalent circuit of the photovoltaic modulator is shown in FIG. 7. At DC and very low frequencies (less than 1 kHz), such voltage gain can be expressed as $$A_v = \Delta V_{mod}/\Delta V_{gs} = -g_m(r_0 || r_d || r_{pc}), \qquad (1)$$

where $g_m = dI_{SW}/dV_{gs}$ is the transistor transconductance, $r_0 = dV_{mod}/dI_{SW}$ is the output resistance of the transistor, and $r_d = dV_{mod}/dI_{mod}$ is the dynamic resistance of the modulator's semiconductor junctions (modeled as a diode D). $r_{pc} = (dI_{pc}/dV_{mod})^{-1}$ (which may be referred to as a differential photocurrent resistance) accounts for the change in the generated photocurrent associated with a change in the voltage at the modulator terminals. Note that, unlike conventional electrical amplifiers, this gain is achieved without the need of external electrical power, due to the self-biasing of the transistor 120 through the photogenerated current $I_{pc}$. Also, there is essentially no energy dissipation associated with the static bias voltage on the gate of the CMOS transistor since the leakage current is less than a picoamp. The device bandwidth is limited by the RC time constant at the modulator terminals, which is $\tau = (C_{mod} + C_{ds})(r_0 || r_d || r_{pc}) \approx C_{mod}(r_0 || r_d)$.

FIG. 8A plots the small-signal gain $A_v$, as a function of bias voltage applied to the transistor 120. Plots are produced from simulations for three different photocurrents and compared with measured results from a microfabricated photovoltaic modulator. Peak gain values between 10 and 15 are possible and relatively independent of photocurrent. Good agreement between measured and simulated results is obtained, although a lower small-signal electrical gain is measured than that predicted by simulation. Other measured data characterizing the fabricated transistors 120 suggest that this difference is due to $g_m$ being about 25% lower in the fabricated transistors than expected. A stronger dependence of $g_m$ on the transistor drain-source voltage ($V_{mod}$ in the example configuration) is observed than that predicted by simulations, which may explain why larger deviations in small-signal gain are obtained for lower generated photocurrents.

The evolution of the peak gain $A_v$, and the 3 dB bandwidth at the bias point that results in the maximum voltage gain $A_v$, are plotted in FIG. 8B and FIG. 8C, respectively. Simulated results are plotted. The observed dependences of gain and bandwidth on $I_{pc}$, may be explained by dependencies of relevant parameters affecting these metrics, namely $g_m$, $R=(r_0||r_d)$, and $C_{mod}$. Their dependencies are plotted in FIG. 8D, FIG. 8E, and FIG. 8F, respectively. Several observations can be made from these dependencies. First, the transistor transconductance $g_m$ increases with increasing photocurrent. This is because the current flowing through the transistor $I_{SW}$, at the maximum gain point increases with larger $I_{pc}$, and in the weak inversion regime $g_m \propto I_{DS}=I_{SW}$. Operation of the transistor in weak inversion is desirable because it results in maximum gain. Second, at the maximum gain point, the system resistance $R=(r_0||r_d) \approx r_0$. This makes the small-signal gain depend solely on the transistor characteristics $|A_{v,max}| \approx g_m r_0$. Third, $R \approx r_0$ decreases with increasing photocurrent. This is because $r_0 \propto 1/I_{SW}$, and as discussed above larger $I_{pc}$, result in larger $I_{SW}$, at the maximum gain point. Additionally, the modulator capacitance $C_{mod}$ does not significantly vary with photocurrent.

With these observations of dependencies, the evolution of $A_v$, and bandwidth shown in FIG. 8B and FIG. 8C may be explained. The plotted results are from numerical simulations. The maximum gain $|A_{v,max}| \approx g_m r_0$ is mostly independent of photocurrent due to the fact that $g_m \propto I_{SW}$ and $r_0 \propto 1/I_{SW}$. The device bandwidth increases with photocurrent due to the decrease in R and the fact that $C_{mod}$ is approximately constant.

Independent of the value of $I_{pc}$, at the maximum gain point the device has a limited speed with a 3 dB bandwidth lower than 200 MHz, mainly caused by the large $r_0$ of the transistor, which is on the order of 1 MΩ or higher as shown in FIG. 8E. Decreasing the output resistance $r_0$ of the transistor can improve the frequency response of the photovoltaic modulator 105. The output resistance of the transistor is given by:

$$r_0 = \frac{1}{\lambda I_{DS}} \quad (2)$$

where $I_{DS}$ is the current flowing through the transistor (which corresponds to $I_{SW}$ in the circuit model of FIG. 7), and λ is known as the channel length modulation parameter, which depends mostly on intrinsic technology parameters:

$$\lambda \propto \sqrt{t_{ox} X_j}/L \quad (3)$$

where $t_{ox}$, is the gate oxide thickness, L is the gate length and $X_j$ is the drain junction depth. For CMOS transistors in deep-submicron technology, typical values for $r_0$ are on the order of 0.1-10 MΩ, which results in bandwidths between 1-100 MHz. One way to decrease ro and increase the modulator's bandwidth is to decrease the transistor's gate length. For the microfabricated photovoltaic modulators described herein from which measurements were made, the gate length was 45 nm. In implemented devices, the gate length L may be between 8 nm and 200 nm. Another way to increase the modulator's bandwidth is to have larger photocurrents (e.g., operate at higher optical powers and/or increase optical absorption and free carrier generation).

A product of the small-signal, low-frequency gain and bandwidth for the photovoltaic modulator describes the trade-off between improved modulation efficiency (sensitivity) and increased speed. The product of DC gain and device bandwidth can be expressed as:

$$|A_v| f_{3dB} = g_m(r_0||r_d) \frac{1}{2\pi(r_0||r_d)C_{mod}} = \frac{g_m}{2\pi C_{mod}} \quad (4)$$

where $f_{3dB}$ is the 3 dB bandwidth of the modulator. FIG. 9A plots a simulated gain curve 910 and a simulated bandwidth 920 curve as a function of gate bias on the transistor 120 for a photovoltaic modulator that generates 10 microamps of photocurrent $I_{pc}$. FIG. 9B plots the simulated product of DC gain and bandwidth as a function of gate bias for photovoltaic modulators operating at three different photocurrents. The maximum value of the product increases for larger photocurrents $I_{pc}$. These results show that a photovoltaic modulator 105 can be biased at a point with a smaller gain (e.g., less than 3) but have a faster frequency response (e.g., over 1 GHz), which can be desirable in applications requiring high data rate communication.

The gain-bandwidth tradeoff may be understood by observing the evolution of the small-signal parameters with bias voltage $V_g$s. A plot of the transistor's transconductance $g_m$ as a function of gate-to-source voltage for a fixed photocurrent $I_{pc}=1$ µA is shown in FIG. 9C. A plot of the system resistance R is shown in FIG. 9D. Because $g_m \propto I_{DS}=I_{SW}$, an increase in $g_m$ is observed as $V_{gs}$ rises due to the fact that a larger current is flowing though the transistor. For large values of $V_{gs}$, channel length modulation (CLM) effects (the dependence of the transistor channel length on the drain-source voltage $V_{ds} = V_{mod}$ in the circuit model) become important and $g_m$ decreases as a consequence. Since $r_0 \propto 1/I_{SW}$, a decrease is observed with increasing $V_{gs}$ because of the rise in the current flowing through the transistor. The diode resistance $r_d \propto 1/I_D$ follows the opposite trend: an increase in $r_d$ is observed with increasing $V_{gs}$, which is explained because the current flowing through the diode decreases as $V_{gs}$ rises. As a consequence, the equivalent resistance $(R \approx r_0|51 r_d)$ at the modulator terminals is dominated by $r_d$ at low values of $V_{gs}$, and by $r_0$ for large $V_{gs}$, as can be seen in the plot of FIG. 9D.

In view of the results of FIG. 9C and FIG. 9D, an increase in $A_v$, for a fixed photocurrent $I_{pc}$ is observed for increasing $V_{gs}$ due to an increase in $g_m$ until CLM effects decrease the gain. The decrease in system resistance R with increasing bias voltage $V_{gs}$ increases the photovoltaic modulator's bandwidth with increasing $V_{gs}$.

As described above, the photovoltaic modulator can be biased at a point with a smaller electrical gain but operate with a larger bandwidth. This tradeoff can be seen in FIG. 9A. The tradeoff between electrical gain and operating bandwidth also involves energy consumption by the photovoltaic modulator 105. The energy consumption of the photovoltaic modulator may be expressed in relation to a conventional optical modulator as an energy gain factor $E_v$, given as:

$$E_v = \quad (5)$$

$$\frac{E_{el,conventional}}{E_{el,PV}} = \frac{\frac{1}{4}C_{mod}V_{DD,conv}^2 + I_{pc}V_{bias}}{\frac{1}{4}C_g V_{pp,PV}^2} = \frac{\frac{1}{4}C_{mod}V_{DD,conv}^2 + I_{pc}V_{bias}}{\frac{1}{4}C_g \left(\frac{V_{DD,conv}}{A_v}\right)}$$

Higher values of $E_v$, (e.g., greater than 10) mean that the photovoltaic modulator consumes significantly less energy than a conventional optical modulator. The energy gain $E_v$, is strongly influenced by the device input capacitance ($C_{mod}$ in a conventional optical modulator and $C_g$ in a photovoltaic modulator). Typical values for the modulator capacitance are on the order of $C_{mod}$>15 fF for a conventional optical modulator. In contrast, the gate capacitance in modern CMOS processes used to fabricate a photovoltaic modulator's transistor 120 is $C_{gb} \approx C_{gs} \approx C_{gd} \approx 0.1$–$1$ fF. However, the electrical gain in a photovoltaic modulator increases the equivalent input capacitance through the Miller effect, resulting in $C_9 \approx C_{gs} + C_{gb} + (1+|A_v|)C_{gd} \approx 1$–$10$ fF. Parasitic interconnect capacitances associated with the electrical pads and/or wiring or metal interconnects may be ignored, since they will be insignificant for photovoltaic modulators where the transistor 120 and optical components of the modulator 105 are fabricated in close proximity to each other (e.g., within 50 microns) on the same substrate. For example, total interconnect capacitances between the transistor 120 and semiconductor junctions of the photovoltaic modulator may be less than or equal to one-tenth of the gate capacitance of the transistor 120 or less than or equal to one-tenth of the modulator capacitance $C_{mod}$. In some cases, the total interconnect capacitances may be less than 5 fF.

The energy gain can be calculated using Eq. (5), assuming that the term $I_{pc}V_{bias}$ is a small contribution to the energy consumption, using $C_{mod}$=20 fF and the value of $C_g$=10 fF. Using $V_{DD,conv} \approx 500$ mV, driving voltages $V_{pp,PV}$ 50 mV are possible. Combined with a gate capacitance $C_g \approx 10$ fF, electrical energy dissipations in the order of $E_{al,PV}=C_g V_{pp,PV}^2/4 \approx 5$ aJ/bit and lower are possible for the driving source. Large energy gains above 100× are achievable with limited bandwidths on the order of 1-50 MHz. On the other hand, lower energy gains on the order of 10× can result in bandwidths above 1 GHz, which is desirable in applications requiring higher switching rates.

Gate Capacitance in Photovoltaic Modulators

To obtain the electrical energy that the external source needs to deliver to drive the photovoltaic modulator 105, an accurate calculation of the input capacitance of the device is needed. In a photovoltaic modulator, this input capacitance corresponds to the gate capacitance $C_g$ of the transistor 120. From the Process Design Kit of the CMOS process used to fabricate a photovoltaic modulator, the physical gate capacitance is $C_{g,phys}=C_{gb}+C_{gs}+C_{gd}$1.3 fF. Nevertheless, the voltage gain obtained in the transistor due to its common source configuration results in an increase in the input capacitance seen by the driving electrical source, resulting in $C_9 = C_{gb} + C_{gs} + (1+|A_v|)C_{gd}$, where $A_v$ is the voltage gain achieved in the example configuration. This increase in input capacitance is known as the Miller effect.

As a result of the Miller effect, the electrical energy dissipation in a photovoltaic modulator cam be given by $E_{el}=[C_{gb}+C_{gs}+(1+|A_v|)C_{gd}]V_{pp}^2/4$. As described above, the small-signal voltage gain $A_v$ is dependent on the voltage at the transistor gate $V_{gs}$. To accurately calculate the electrical energy consumed in the example photovoltaic modulator an effective gain $A_{v,eff}$ can be defined as follows:

$$A_{v,eff} = \frac{1}{V_{gs,max} - V_{gs,min}} \int_{V_{gs,min}}^{V_{gs,max}} A_v(V_{gs})dV_{gs} \quad (6)$$

With this definition, the energy delivered by the external electrical source to drive the modulator is given by $E_{el} = [C_{gb}+C_{gs}+(1+|A_{v,eff}|)C_{gd}]V_{pp}^2/4$. It is assumed that the physical capacitances $C_{gb}$, $C_{gs}$ and $C_{gd}$ are constant with voltage, which is a valid approximation when the device is operated near the maximum gain point in the subthreshold regime. From the PDK of the CMOS process, the example transistor 120 has $C_{gb}$=0.3 fF, $C_{gs}$=0.6 fF and $C_{gd}$=0.4 fF at typical operating points of the photovoltaic modulator. These values do not depend strongly on the generated photocurrent $I_{pc}$, and are the values used to calculate the energy consumption described herein.

$A_{v,eff}$ will have some dependence both on the amplitude of the driving signal $V_{gs,pp}=V_{gs,max}-V_{gs,min}$ and its DC bias $V_{gs,DC}=(V_{gs,max}+V_{gs,min})/2$. FIG. 9E plots the equivalent input capacitance $C_g = C_{gs}+(1|A_{v,eff}|)C_{gd}$ as a function of the amplitude of the driving signal $V_{gs,pp}$, assuming that the device is biased at a voltage $V_{gs,DC}$ that results in the maximum voltage gain. Both the $C_g$ inferred from the circuit simulations and that inferred from measurements of the gain are shown in the graph. Since the measured gain is lower than that predicted by simulations (as described above in connection with FIG. 8A), so is the equivalent input capacitance $C_g$. The capacitance decreases as the peak-to-peak voltage $V_{gs,pp}$ increases, indicating a decrease in $A_{v,eff}$. This is because the voltage gain $A_v$ decreases very rapidly when the gate voltage is not at the optimum value as can be seen from FIG. 8A.

The Effect of the Differential Photocurrent Resistance $r_{pc}$

For the analyses of the photovoltaic modulator described herein, it is assumed that the equivalent resistance associated to the change in photocurrent with the voltage at the modulator terminals $r_{pc}=(dI_{pc}/dV_{mod})^{-1}$ is much larger than the diode dynamic resistance $r_d$ and the transistor output resistance $r_0$, so that $r_d||r_0||r_{pc} \approx r_d||r_0$. It is informative to study the validity of this assumption to understand how $r_{pc}$ could affect the operation of a photovoltaic modulator.

For any photovoltaic modulator, a change in the voltage at the modulator terminals $V_{mod}$ will be accompanied by a change in the photogenerated current $I_{pc}$. For example, in a photovoltaic modulator that uses a ring resonator, a change in $V_{mod}$ will shift the resonance wavelength of the device. The shift in resonance wavelength can change the optical power absorbed in the ring, resulting in a change in $I_{pc}$. Consequently, $r_{pc}=(dI_{pc}/dV_{mod})^{-1}$ has a finite value and can affect the performance of a photovoltaic modulator.

An expression for the value of $r_{pc}$ can be derived recognizing that the generated photocurrent is given by $I_{pc}=RP_{abs}$, where R is the device responsivity and $P_{abs}$ is the optical power absorbed in the modulator. Accordingly, $$\frac{dI_{pc}}{dV_{mod}} = R\frac{dP_{abs}}{dV_{mod}} = RP_{in}\frac{d(1-T)}{dV_{mod}} = -RP_{in}\frac{dT}{d\lambda}\frac{d\lambda}{dV_{mod}} \quad (7)$$

where $T=P_{out}/P_{in}$ is the transmission through the ring, and $P_{abs}=P_{in}(1-T)$. The term $d\lambda/dV_{mod}$ can be rewritten as the intrinsic modulation efficiency of the example photovoltaic modulator $-d\lambda_0/dV_{mod}$. The expression for $r_{pc}$ can then be written as:

$$r_{pc} = \frac{1}{\frac{dI_{pc}}{dV_{mod}}} = \left(RP_{in}\frac{dT}{d\lambda}\frac{d\lambda_0}{dV_{mod}}\right)^{-1} \quad (8)$$

FIG. 9F plots the calculated $r_{pc}$ as a function of laser wavelength using Eq 8 for the example photovoltaic modulator of FIG. 2. Plots are generated for different input optical powers. The calculations were based on a responsivity R=0.034 A/W, a modulation efficiency $d\lambda_0/dV_{mod}$=−20 pm/V and a Lorentzian resonance with $Q_{coup}$=20,000, $Q_{int}$=9,000 and $\lambda_0$=1270 nm. Several observations can be made from the plotted results. First, for a given input optical power, the minimum achievable values of $r_{pc}$ are about 10× larger than typical values for $r_d\|r_0$ (compare with FIG. 8E). This confirms that the assumption $r_d\|r_0\|r_{pc} \approx r_d\|r_0$ is valid for the example photovoltaic modulator. Second, negative values of $r_{pc}$ can be obtained when the laser wavelength is at the red side of the resonance ($\lambda_l > \lambda_0$). This is because in a Lorentzian resonance, $dT/d\lambda > 0$ for $\lambda_l > \lambda_0$.

Although for the example microfabricated photovoltaic modulator $r_{pc} \gg r_0\|r_d$, a scenario where $r_{pc}$ becomes comparable to $r_0$ (or even $r_{pc} < r_0 \|r_d$) is possible by, for example, using a modulator with a larger modulation efficiency $d\lambda_0/dV_{mod}$ or a sharper resonance (and therefore larger $dT/d\lambda$). In this case, $r_{pc}$ should be accounted for when computing the small-signal gain and bandwidth. The inclusion of $r_{pc}$, results in the following expressions:

$$A_v = g_m(r_0\|r_d\|r_{pc}) \quad (9)$$

$$f_{3dB} = \frac{1}{2\pi C_{diode}(r_0\|r_d\|r_{pc})} \quad (10)$$

$$r_0\|r_d\|r_{pc} = \frac{r_{pc}(r_0\|r_d)}{r_{pc}+(r_0\|r_d)} \quad (11)$$

If a device is operated where $r_{pc} \ll r_0\|r_d$, then $r_d\|r_0\|r_{pc}$. This would result in less small-signal gain $A_v$ than that predicted by our simulations, but an increased frequency response $f_{3dB}$.

An interesting situation arises if the modulator were operated at a bias point where $r_{pc} \approx -r_0\|r_d$. In this case, $r_0\|r_d\|r_{pc} \to \infty$, which makes $A_v \to \infty$ and $f_{3dB} \to 0$. The possibility of synthesizing negative resistances is interesting for other applications beyond modulation, such as the realization of on chip oscillators.

From the above analysis, $r_{pc}$ can significantly affect the photovoltaic modulator behavior if the photogenerated current depends strongly on the voltage applied at the modulator terminals. This was not the case for the microfabricated photovoltaic modulator in accordance with the design of FIG. 2, but it could be important in other devices with increased modulation efficiency or higher Q factor.

Photocurrent Generation

Harvesting of free carriers generated in an optical modulator to provide energy to operate the modulator can apply to any optical modulator (regardless of material platform, structure, operational principle) that can act as a photovoltaic cell, i.e., that generates free carriers and develops a photovoltage when light is input to the device. The source of these free carriers and associated photocurrent can be either intentional or due to parasitic effects.

Free carrier generation is present in electro-absorption modulators, since these devices achieve modulation by the absorption of the input optical power (e.g., when a '0' bit is transmitted). The optical absorption can generate electron-hole pairs and a photocurrent in the device as a result. A photovoltaic modulator using electro-absorption may comprise a single optical waveguide having a section where electro-absorption occurs with one or more semiconductor junctions disposed in the section. The semiconductor junction(s) may comprise n-type regions and p-type regions and may be configured like those depicted in FIG. 2 (connecting (in parallel) to terminals of a transistor 120. The section having the semiconductor junctions may be straight or comprise one or more curves. The section may couple to another section of the waveguide where optical radiation is received. A photovoltaic modulator using electro-absorption may look like the single arm 512 of the Mach-Zehnder interferometer 510 in FIG. 5, where the waveguide may or may not be curved.

On the contrary, there is in principle no reason why electro-refraction modulators should generate free carriers since they rely on the change in refractive index with applied voltage and not on optical absorption mechanisms. In particular, silicon-based optical modulators typically operate at wavelengths well below the bandgap of the silicon through which the optical wave travels and is modulated. The most common operating wavelength regions for silicon modulators are around 1300 nm and 1550 nm. Therefore, one might expect that linear optical absorption and free carrier generation in such devices would not occur. However, there exists several physical mechanisms in silicon-based optical modulators (and other electro-refractive modulators where the operating wavelength is below the bandgap of the semiconductor material) for absorbing light with energy below the bandgap to produce significant free carriers.

Three different mechanisms contribute to free carrier generation in silicon optical waveguides. One mechanism is defect mid-bandgap absorption (DMBA), which is due to the presence of crystalline defects or foreign atoms in the bulk of the Si waveguide. Such defects break the crystal periodicity and generate states with energy levels within the bandgap. By intentionally adding defects into a silicon waveguide through ion implantation, mid-IR photodetectors with responsivities as high as 0.8 A/W over a wavelength range from 1270 nm to 1700 nm have been realized. Another mechanism is surface state absorption (SSA). The termination of the crystal structure at the surface of a semiconductor distorts its band structure and creates intra-gap states, which can then result in sub-bandgap light absorption. A third mechanism is two-photon absorption (TPA), where the simultaneous absorption of two photons results in the generation of an electron-hole pair. Since TPA is a nonlinear effect, high input optical powers and/or resonant structures may be needed to generate appreciable free carriers by this mechanism.

At moderate input optical powers, SSA is believed to be the dominant free carrier generation mechanism in modern silicon photonic waveguides over DMBA. This is because the high quality of the fabrication process results in a low density of defects in the bulk of the Si waveguide, and thus reduced DMBA. Two main factors dominate the strength of SSA in optical waveguides: (1) the overlap of the optical mode with the silicon surface, and (2) the quality of the surface passivation. SSA does not show a strong wavelength dependence in the wavelength ranges of interest for optical modulation.

Besides absorption mechanisms intrinsic to the silicon or semiconductor waveguide, another approach for free carrier generation is the addition of other materials with a smaller bandgap such as germanium (Ge), which usually involves the use of modified silicon photonic processes since pure Ge is not a standard layer in CMOS foundries. Nonetheless, silicon-germanium (SiGe) is used in standard CMOS to strain the channel of pFET transistors, and SiGe can be used to increase optical absorption in unmodified CMOS platforms. SiGe may be useful for O-band wavelengths and below, since the absorption edge of SiGe alloys is near 1300 nm.

For some implementations, post CMOS processing may be performed on a photovoltaic modulator to increase optical absorption. For example, a portion of the device's waveguide(s) may be subjected to ion bombardment or ion implantation and anneal to create defects or regions having a smaller bandgap.

The SSA can be characterized by a surface state absorption parameter $a_{SSA}$. The value of this parameter will depend upon the waveguide design and process used to fabricate the waveguide. Using a value of $a_{SSA}=1$ m$^{-1}$ (which translates into a loss of 0.04 dB/cm) an estimated responsivity R of a photovoltaic modulator can be obtained. The value of $a_{SSA}$ used here is estimated from published literature for similar waveguides fabricated by a similar process to the waveguides of the photovoltaic modulators described herein.

Using this value for $a_{SSA}$ an estimated responsivity R of around 1 mA/W is obtained for Si-only waveguides and a waveguide design associated with FIG. 2. Such a responsivity can provide photocurrents close to 1 µA for standard operating optical powers provided to a photovoltaic modulator.

It is also possible to estimate the quantum efficiency η for a modulator using the estimate of $a_{SSA}$. The quantum efficiency can be expressed as:

$$\eta = 1 - exp(-a_{SSA} L_{eff}) \quad (12)$$

For Mach-Zehnder modulators, $L_{eff}$ corresponds to the device length L. In the case of resonant devices, $L_{eff}=F L/2\pi$, where F is the finesse of the resonance.

FIG. 9G plots measured photovoltaic responses (open circuit voltages as a function of input optical power in the waveguide) for two microfabricated CMOS resonant optical modulators. The curve to the right corresponds to a Si-only device having a ring resonator where free carrier generation is primarily due to SSA. The curve to the left corresponds to a device of similar design where the ring resonator incorporates a SiGe band. The latter device was used for a demonstration of photovoltaic modulation and yielded the measured results as described herein. FIG. 9H plots short circuit current as a function of input optical power.

A responsivity R =0.85 mA/W was measured for the Si-only modulator, which is in good agreement with the 1 mA/W estimate described above. The addition of SiGe results in an increased responsivity (R=34 mA/W) due to absorption from phonon-assisted indirect electronic transitions at wavelengths around 1280 nm. Open circuit voltages above 0.5 V and photogenerated currents on the order of 1 µA for small input optical powers on the order of 10 µW are measured.

For the silicon resonator incorporating a SiGe band, a total waveguide loss of 27.5 dB/cm is measured. From the total, 2.6 dB/cm (0.6 cm$^{-1}$) correspond to phonon-assisted absorption resulting in the generation of free carriers. The additional 24.9 dB/cm loss are mainly from free carrier absorption due to the presence of doped regions in the areas where the optical mode is propagating.

Modulator Performance

To evaluate the optical performance of a photovoltaic modulator, a resonant modulator is considered (e.g., the modulator design of FIG. 2 having a ring resonator). A similar analysis can be used to evaluate photovoltaic modulation in Mach-Zehnder modulators.

The voltage swing at the modulator terminals $V_{mod}$ changes the electron and hole density in the silicon and hence the refractive index of the optical resonator via the plasma dispersion effect. The change in refractive index results in a shift in the resonance wavelength ($d\lambda_0$) of the device which can be expressed as:

$$d\lambda_0 = \frac{d\lambda_0}{dV_{mod}} \frac{dV_{mod}}{dV_{gs}} dV_{gs} = \frac{d\lambda_0}{dV_{mod}}\bigg|_{V_{mod,bias}(V_{gs,bias})} A_v(V_{gs,bias}) dV_{gs} \quad (13)$$

where $d\lambda_0/dV_{mod}$ is the modulation efficiency of the optical modulator (which may be referred to as the intrinsic modulation efficiency) and $A_v$ is the electrical gain of the photovoltaic modulator. Eq. 13 indicates that both the intrinsic modulation efficiency and the gain depend on the bias point.

FIG. 9I plots the results of evaluating Eq. 13 using small-signal gain values $A_v$ determined from the circuit simulation as described above and using representative values for $d\lambda_0/dV_{mod}$ based on measured results that are plotted in the inset of FIG. 9I. Results are plotted for three values of photocurrent $I_{pc}$. Even for small photocurrents, shifts larger than 200 pm/V are achievable, which is more than ten times larger than the 20 pm/V achievable with conventional optical modulators (dashed line in the plot). Such enhancement is due to the electrical gain achieved in photovoltaic modulation.

The resulting larger modulation efficiencies with higher photocurrents is not obvious, since the maximum electrical gain $A_v$ is relatively independent of $I_{pc}$ (as plotted in FIG. 8B). The larger intrinsic modulation efficiencies $d\lambda_0/dV_{mod}$ with larger photocurrents may result because the operating voltage at the modulator terminals $V_{mod}$ increases, which sets the operating point of the modulator's semiconductor junctions in the weak forward bias, where modulation efficiency is larger than in reverse bias (see the inset of FIG. 9I). By comparing the peak modulation efficiencies of FIG. 9I with the peak gain values in FIG. 8A, it can be observed that the point of maximum modulation efficiency does not coincide with the bias that gives peak electrical gain.

The total wavelength shift for a voltage swing at the input of the photovoltaic modulator between $V_{gs,min}$ and $V_{gs,max}$ is obtained by integrating Eq. (13):

$$\Delta\lambda_0 = \int_{V_{gs,min}}^{V_{gs,max}} \frac{d\lambda_0}{dV_{mod}}\bigg|_{V_{mod}(V_{gs})} A_v(V_{gs}) dV_{gs} \quad (14)$$

The value of $\Delta\lambda_0$ depends on the amplitude of the applied voltage $V_{gs,pp}=V_{gs,max}-V_{gs,min}$ and on the DC voltage $V_{gs,DC}=(V_{gs,max}+V_{gs,min})/2$. FIG. 9J plots the maximum achievable $\Delta\lambda_0$ as a function of $V_{gs,pp}$ for a photovoltaic modulator and a conventional modulator (dashed line), assuming that the optimal $V_{gs,DC}$ is chosen. For driving voltages <100 mV$_{pp}$ the resonance shifts can increase by a factor between 10 and 40 when compared to conventional modulation.

A saturation of $\Delta\lambda_0$ is observed for larger driving voltages. This is because the maximum voltage swing at the modulator terminals corresponds to the difference between the open circuit and short circuit conditions $\Delta V_{mod,max}=V_{OC}-V_{SC}=V_{OC}-0=V_{OC}$. The maximum achievable resonance shift in the photovoltaic modulator can be expressed as:

$$\Delta\lambda_{0,sat} = \int_0^{V_{oc}} \frac{d\lambda_0}{dV_{mod}}\bigg|_{V_{mod}} dV_{mod} \qquad (15)$$

An increase in $\lambda\Delta_{0,sat}$ is observed with increasing photocurrent due to an increase in the open circuit voltage. Conventional optical modulators of similar design do not have such limitation in the maximum achievable wavelength shift. For large peak-to-peak driving voltages (>500 mVpp) conventional modulators will provide larger resonance shifts compared to photovoltaic modulation. Accordingly, photovoltaic modulation may be more beneficial for low peak-to-peak driving voltages (e.g., <100 mV$_{pp}$), where there is no saturation of $\Delta\lambda_0$.

From the resonance wavelength shift data in FIG. 9J, modulation characteristics for a photovoltaic modulator can be determined if the resonance shape $T(\lambda)$ (transmission as a function of wavelength) of the modulator is known. For a photovoltaic modulator having a ring resonator, a Lorentzian resonance shape may be used which is described in terms of its quality factors Q. The total Q factor of the resonance, usually called loaded Q ($Q_{loaded}$), is the inverse sum of the Q factors associated with each loss mechanism in the ring: $Q_{loaded}^{-1}=Q_{coup}^{-1}+Q_{int}^{-1}$. $Q_{coup}$ is associated with the optical loss due to the coupling of light from the ring to the output bus waveguide, and $Q_{int}$ is associated with the internal loss mechanisms in the ring, which are mainly radiation, scattering and absorption. The optical transmission through the ring can then be expressed as:

$$T(\lambda_l) = \frac{\left(1-\frac{\lambda_0}{\lambda_l}\right)^2 + \frac{1}{4Q_{coup}^2} + \frac{1}{4Q_{int}^2} - \frac{1}{2Q_{coup}Q_{int}}}{\left(1-\frac{\lambda_0}{\lambda_l}\right)^2 + \frac{1}{4Q_{coup}^2} + \frac{1}{4Q_{int}^2} + \frac{1}{2Q_{coup}Q_{int}}} \qquad (16)$$

where $\lambda_0$ is the resonance wavelength of the ring and $\lambda_l$ is the laser wavelength. When $Q_{coup}=Q_{int}$ the ring is said to be in the critical coupling condition, and the transmission is T=0 on resonance ($\lambda_l=o_0$).

With $T(\lambda)$ and the resonance wavelength shift for a given input signal at the transistor gate, the device's extinction ratio (ER) and insertion loss (IL) can be determined from the following expressions.

$$ER = |T(\lambda_l) - T(\lambda_l - \Delta\lambda_0)| \qquad (17)$$

$$IL = \max[T(\lambda_l), T(\lambda_l - \Delta\lambda_0)] \qquad (18)$$

Different values of ER and IL can be achieved for a given $\Delta\lambda_0$ depending on the operating laser wavelength $\lambda_l$. For the following plots of ER an operating wavelength $\lambda_l$ is selected that results in a high value for ER, subject to the limitation that IL<6 dB.

Besides the Q factors and the operating wavelength $\lambda_l$, the modulation performance is dependent on the photocurrent $I_{pc}$, the DC bias voltage $V_{gs,DC}$ and the peak-to-peak voltage $V_{gs,pp}$, whose combination determines the achieved wavelength shift $\Delta\lambda_0$ as described above. Additionally, both $V_{gs,DC}$ and $I_{pc}$ determine the 3 dB bandwidth of the device.

Given a resonance shape $T(\lambda)$ and a generated photocurrent $I_{pc}$, varying $V_{gs,pp}$ and $V_{gs,DC}$ will change $\Delta\lambda_0$ and, as a consequence, change the ER.

Surface plots can be generated for ER in terms of energy dissipation (which is directly translated to $V_{gs,pp}$ through $E=C_g V_{pp}^2/4$) and 3 dB bandwidth (which is set by $V_{gs,DC}$). Two surface plots are shown in FIG. 9K and FIG. 9L for a photocurrent $I_{pc}=1$ µA. FIG. 9K corresponds to a ring resonator having $Q_{int}=11,000$, $Q_{coup}=13,000$, $Q_{loaded}=6,000$, while FIG. 9L corresponds to a ring resonator having $Q_{int}=22,000$, $Q_{coup}=26,000$, $Q_{loaded}=12,000$. The corresponding resonance shapes $T(\lambda)$ for the modulators are also plotted as the inset between the two figures with the broader shape for FIG. 9K and the narrower shape for FIG. 9L.

The largest ER values are achieved for the highest energy dissipation (i.e., a larger peak to peak driving voltage) and the lowest bandwidth (where larger electrical gains are obtained). Increasing bandwidths result in smaller ER because the small signal gain $A_v$ decreases, and therefore a smaller $\Delta\lambda_0$ is obtained for the same driving signal. Similarly, larger Q factors achieve better performance because $T(o)$ is narrower, and therefore the same $\Delta\lambda_0$ results in a larger change in transmission. Increasing the photocurrent $I_{pc}$ results in an overall upwards shift of the ER surface due to the larger $\Delta\lambda_0$ achievable.

FIG. 9M includes representative slices through each of the surface plots of FIG. 9K and FIG. 9L (curves corresponding to $I_{pc}=1$ µA). The crosses correspond to a Lorentzian resonance with a loaded quality factor $Q_{loaded}=6,000$, and the dots to $Q_{loaded}=12,000$. ER on the order of 1 dB (20% change in transmission) can be achieved at bandwidths close to 10 MHz for low electrical energy consumptions between 100 zJ/bit and 500 zJ/bit. While relatively low, such ER is enough to achieve close to error-free communication at these data rates. For comparison, the same ring resonator device with the same modulation efficiency would only achieve ER≈0.04 dB if modulated with a 100 zJ/bit electrical energy using the conventional carrier depletion (reverse-biased) approach. For the photovoltaic modulator at energies>1 aJ/bit, ER>2 dB at speeds approaching 1 GHz can be achieved.

Additional measured and simulated results corresponding to a microfabricated photovoltaic modulator in accordance with the design of FIG. 2 are shown in FIG. 10A through FIG. 10D. The photovoltaic modulator included a ring resonator with 5 µm outer diameter and 1.2 µm width, designed for operation at wavelengths around 1270 nm. The PV modulator uses interdigitated p-n junctions around the circumference of the ring resonator, as depicted in FIG. 2. While the intrinsic absorption of silicon could be used for photovoltaic modulation, a ring of silicon germanium (SiGe) with bandgap wavelength of approximately $\lambda_{bandgap}=1215$ nm was embedded to enhance optical absorption and the photovoltaic effect. The SiGe ring is 300 nm wide and has partial overlap with the ring resonator's optical mode, resulting in a measured responsivity of R=34 mA/W.

The control transistor 120 comprises a body-contacted nMOS transistor for modulating the photogenerated charge in the ring resonator 110. The transistor 120 has a nominal gate length and width of 56 nm and 2.4 µm, respectively. From the electrical model provided by the foundry, the input gate capacitances are $C_{gb} \approx C_{gs} \approx C_{gd} \approx 0.5$ fF. Minimum width transistors in the same process have smaller input capacitances on the order of 0.1 fF, which would result in decreased energy consumption.

FIG. 10A plots DC transmission spectra for five different gate bias voltages ($V_{gs,DC}$) and for 37.5 µW on-chip optical power. This optical power yielded a photogenerated current $I_{pc}$=1.25 µA. As the transistor increasingly turns on, the voltage at the modulator terminals $V_{mod}$ decreases, resulting in a reduction in the free-carrier density and a blue shift in the resonance wavelength.

FIG. 10B plots the photovoltaic modulator's frequency response for two operating conditions: $I_{pc}$=0.22 µA (lower curve) and $I_{pc}$=3.2 µA (upper curve). The crosses correspond to experimentally measured values, while solid lines are simulation results. The dashed black line shows the response of a conventional reverse-biased modulator. An increase in the 3 dB bandwidth is observed when photocurrent is increased: from 4.6 MHz for $I_{pc}$=0.22 µA to 35 MHz for $I_{pc}$=3.2 µA. There is good agreement between measured and simulated results. The dashed black line shows the frequency response of the same device operated in a conventional, reverse-biased configuration with the same electrical energy dissipation. The response at low frequencies is significantly weaker than that of the photovoltaic modulator due to the absence of voltage gain, but the frequency response is faster with a 3 dB bandwidth close to 5 GHz.

FIG. 10C and FIG. 10D plot output optical signals for the photovoltaic modulator of FIG. 2 with driving signals applied to the control transistor's gate of 100 mV$_{pp}$ (FIG. 10C) and 4 mV$_{pp}$ (FIG. 10D). The histograms of the detected '1' and '0' bits, corresponding eye diagrams, and the modulation characteristics are also shown (OMA-optical modulation amplitude). For these results the signal data rate is 1 Mbps and the on-chip optical power is 7.5 µW, corresponding to $I_{pc}$=0.25 µA.

FIG. 10C shows for a photovoltaic modulator biased at the point of maximum modulation efficiency, a 100 mV$_{pp}$ peak-to-peak voltage signal applied to the transistor gate results in 0.6 dB ER with 7.5 µW on-chip input optical power and needs only 8.75 aJ/bit electrical energy to be delivered by the electrical driving source. Observable modulation can be achieved with input peak-to-peak voltages as low as 4 mV$_{pp}$, corresponding to a 23.2 zJ/bit electrical energy consumption as shown in FIG. 10D. The performance of the photovoltaic modulator can be expressed in terms of the number of electrons that the external driver needs to provide to achieve optical switching. For a 200 mV$_{pp}$ (20 mV$_{pp}$) driving voltage, corresponding to a 25 aJ/bit (550 zJ/bit) electrical energy dissipation, only 2,500 (550) electrons need to be provided by the external driver. The IL for the modulator is lower than 3 dB, which is comparable to the IL of most modern and conventional optical modulators.

The eye diagrams in FIG. 10C and FIG. 10D indicate that low error-rate communications are possible with photovoltaic modulators. For some low-bandwidth applications (such as sensing applications described above), the low-bandwidth communication link can substantially decrease the equivalent noise power of the receiver chain detecting the modulated signal(s) generated by the photovoltaic modulator. As such, close to error-free transmission is possible with the ER levels (<1 dB) demonstrated in FIG. 10C and FIG. 10D. In telecommunications applications, error-free communication is generally assumed for BER<$10^{-9}$, while data communication applications usually require a BER<$10^{-12}$. From signal-to-noise calculations considering systems limited by shot noise and receiver electrical noise, it can be shown that operating a photovoltaic modulator system at bandwidths $\Delta f$<100 MHz enables error-free communication with ER on the order of 0.5 dB for received optical powers above ~2 µW.

The demonstrated photovoltaic optical modulator operates with a total power dissipation (optical and electrical) of less than 8 µW, and only requires 8.75 pW of electrical energy from the electrical driving source for 1 Mbps operation, making it possible for an electrical sensor to directly drive the modulator without the need for amplification, as depicted in FIG. 4. Such data rate and power offer significant improvements over the state-of-the-art and may enable 1,000's of high-density, parallel sensing interconnects.

Additional configurations of photovoltaic modulators are possible. The photovoltaic modulator 105 of FIG. 2 and FIG. 3B is connected in a common source (CS) arrangement with the transistor 120. The voltage at the transistor source is fixed and connected to ground. Because of the circuit gain $A_v$, this configuration results in the lowest electrical energy consumption for the photovoltaic modulator. However, the modulator has a limited bandwidth due to the large output resistance of the transistor.

In another implementation, the photovoltaic modulator 105 may be connected in a common drain (CD) configuration, as depicted in the equivalent circuit model of FIG. 11. The configuration trades an increase in energy consumption for a higher modulation bandwidth. The circuit configuration resembles a source-follower transistor configuration. A pMOS transistor may be used for this circuit arrangement. For this configuration, the gain $A_v$, can be expressed as follows.

$$A_v = \frac{g_m r_0}{1 + g_m r_0} \qquad (19)$$

In this case, the gain is less than unity, but now the output resistance of the transistor is given by $r_{out,CD}$=1/$g_m$ which can be >10× smaller than $r_{out,CS}$=$r_0$. For the microfabrication process used to fabricate the example photovoltaic modulators (GlobalFoundries 45RFSOI), $r_{out,CD} \approx r_{out,CS}$/13. It is therefore possible to achieve a 13-times faster device for the same generated photocurrent $I_{pc}$ as shown in FIG. 12. The bandwidth for the common-drain configuration can be expressed as follows.

$$f_{3dB,CD} = \frac{1}{2\pi RC} = \frac{g_m + 1/r_0 \| r_d}{2\pi(C_{diode} + C_{ds})} \approx \frac{g_m}{2\pi C_{diode}} \qquad (20)$$

The increase in bandwidth for the CD configuration comes at the cost of larger electrical energy dissipation. Since there is no electrical gain ($A_v \approx 1$), the driving signal applied at the input of the transistor should be larger than that necessary in the CS configuration.

The energy dissipation $$\left(E = \frac{1}{4} C_{in} V_{pp}^2\right)$$

configurations can be compared using the following expression.

$$\frac{E_{CD}}{E_{CS}} = \frac{C_{in,CD}V_{pp,CD}^2}{C_{in,CS}V_{pp,CS}^2} \qquad (21)$$

It is considered that $V_{pp,CD} = A_{v,CD} * V_{pp,CS}$, i.e., the electrical voltage applied to the input of the CD photovoltaic modulator is the electrical voltage applied to the CS photovoltaic modulator multiplied by the electrical gain of the CS configuration. The input capacitance is different in the CS and CD configurations because of the Miller effect. Assuming that the Miller effect makes $C_{in,CS} \approx 5C_{in,CD}$ and that $A_{v,CS} \approx 10$, then energy consumption for the CD configuration is about a factor of 20 more than the CS configuration. Although the CD photovoltaic modulator configuration achieves about a 10-times increase in bandwidth for the same generated photocurrent compared to a CS configuration, its energy dissipation increases by about a factor of 20.

Table 1 compares electrical and optical characteristics of CS and CD photovoltaic modulators. For some applications, the CD configuration may need amplification of the drive signal.

TABLE 1

Operating parameters for common-drain and common-source photovoltaic modulators.

| | Common Drain | Common Source |
|---|---|---|
| Drive signal modulation (peak-to-peak) | 0.5 V | 50 mV |
| Corresponding electrical consumption | 62.5 aJ/bit | 3.12 aJ/bit |
| Drive signal modulation (peak-to-peak) | 1.0 V | 100 mV |
| Corresponding electrical consumption | 250 aJ/bit | 12.5 aJ/bit |
| Operating wavelength | 1270 nm | 1270 nm |
| Optical power | 150 µW | 2 mW |
| Optical consumption | 73.5 fJ/bit | 1 pJ/bit |
| Operating wavelength | 1180 nm | 1180 nm |
| Optical power | 15 µW | 200 µW |
| Optical consumption | 7.35 fJ/bit | 100 fJ/bit |

While the energy dissipation is larger than that for the CS configuration, the CD configuration has lower energy dissipation than a conventional modulator, because the input capacitance for the CD photovoltaic modulator is the input capacitance of the transistor which is about one-twentieth that of conventional modulators. Consequently, the CD configuration still achieves a 20-fold decrease in electrical energy dissipation when compared to a conventional optical modulator.

An additional advantage for the CD configuration is that it does not require a bias voltage at the transistor input. In the CS configuration biasing of the transistor may be used to get the largest electrical gain (and therefore the lowest energy dissipation). The CD configuration can operate at maximal performance for a 0 V bias voltage.

The CS photovoltaic modulator configuration can provide signal gain and very low energy dissipation, whereas the CD configuration can provide higher speed than the CS configuration. A possible way to obtain gain and improved bandwidth in a photovoltaic modulator is to implement the device with two stages. FIG. 13 depicts a circuit model for a two-stage photovoltaic modulator 1300 having a first stage 1310 and a second stage 1320. The device employs two transistors M1, M2 and an inductor L connected to two sections 110-1, 110-2 of a same optical modulator structure.

Referring again to FIG. 2, for example, a first portion of the p-type regions 116 and n-type regions 114 (extending part way around the ring resonator 110) may connect to the inductor L and first transistor. A second portion of the p-type regions 116 and n-type regions 114 (extending around a remaining portion of the ring resonator 110) may connect to the second transistor M2. There can be DC coupling between the first stage 1310 and the second stage 1320.

The inductor L can provide a block for, or significantly attenuate, an AC modulating signal that is generated at the control terminal of the second transistor M2 (e.g., gate in the illustrated example). The generated modulating signal is in response to a modulating signal $V_{in}$ applied to the control terminal of the first transistor $M_1$. The inductor L is used to reduce an amount of modulating signal that leaks into the first section 110-1 of the optical modulator structure and thereby increase the amount of modulating signal applied to the second transistor M2.

The total photocurrent $I_{pc,T}$ generated by a single modulator can then be divided according to the two sections: one section 110-2 with a fraction a of the total current, and the other section 110-1 with a fraction (1–a). Each of these photocurrents can drive a different amplification stage of the two-stage photovoltaic modulator 1300. For example, the first section 110-1 can drive the CS stage (which may be the first stage 1310) and the second section 110-2 can drive the CD stage (which may be the second stage 1320).

For the example two-stage photovoltaic modulator 1300, the first section 110-1 may not be modulated and therefore issues relating to modulation efficiency do not apply for that stage. The second section 110-2 is modulated, so that it is beneficial to obtain high modulation efficiency for the second section. It may be beneficial to have the CS stage as the first stage of the two-stage photovoltaic modulator 1300, since it can drive the pMOS transistor input capacitance instead of the modulator capacitance, increasing the bandwidth.

The gain of the two-stage photovoltaic modulator 1300 can be expressed as the gain of the individual stages ($A_{v,CS} * A_{v,CD}$) which reduces approximately to $A_{v,CS}$ since the gain of the CD stage is between about 0.9 and 1. Regarding bandwidth, the circuit for the two-stage photovoltaic modulator comprises a 2-pole system for which bandwidth limitations at the output of the two stages should be considered. The time constant at the output of the first (CS) stage can be expressed as $$\tau_1 = r_{o1}C_{g2} \qquad (22)$$

where $C_{g2}$ is the input capacitance of the pMOS transistor. The time constant at the output of the second (CD) stage can be expressed as $$\tau_2 = \frac{C_{mod}}{g_{m2}} \qquad (23)$$

where $g_{m,2}$ is the transconductance of the pMOS transistor. Whichever of these two time constants is smaller will limit the frequency response of the photovoltaic modulator 1300. Eq. (22) and Eq. (23) relate to the bandwidth for each stage as follows.

$$f_{3dB}(CS) = \frac{1}{2\pi r_{o1}C_{g2}} \qquad (24)$$

$$f_{3dB}(CD) = \frac{g_{m2}}{2\pi C_{mod}} \qquad (25)$$

FIG. 14 plots calculated bandwidth for each stage 1310, 1320 of a two-stage photovoltaic modulator as a function of photocurrent in each stage. The calculations use the following values: $C_{mod}$=20fF, $C_{g2}$=1fF, $$g_{m2} = \frac{qI_{ds2}}{nKT}$$

(where n=1.5), and $$r_{01} = \frac{1}{\lambda I_{ds1}}$$

(where o=0.2). FIG. 14 also plots bandwidth for the single-stage photovoltaic modulator of FIG. 2 (CS configuration). The two-stage photovoltaic modulator can operate with about ⅛th the amount of photocurrent, while still achieving the same gain. Equivalently, the two-stage photovoltaic modulator can increase the operating bandwidth by about a factor of 8 compared to a single-stage CS photovoltaic modulator using the same generated photocurrent.

Various configurations of a photovoltaic modulator may be implemented. Some example configurations are listed below.

(1) An electro-optic transducer comprising: a first waveguide section to receive optical radiation; and one or more semiconductor junctions formed along a second waveguide section to modulate the optical radiation, wherein the second waveguide section is optically coupled to the first waveguide section and wherein each semiconductor junction comprises a first region of n-type semiconductor material and a second region of p-type semiconductor material, and wherein the optical radiation, when received, generates an amount of free carriers in the second waveguide section that is a majority of a total amount of free carriers provided to the second waveguide section to modulate the optical radiation.

(2) The electro-optic transducer of configuration (1), further comprising: a transistor having: a control terminal; and current-carrying terminals that are connected in parallel to the one or more semiconductor junctions and configured to switch the transistor between providing a short circuit and providing an open circuit between the first region of n-type semiconductor material and the second region of p-type semiconductor material dependent upon a signal applied to the control terminal.

(3) The electro-optic transducer of configuration (2), wherein the transistor is formed on a same substrate and formed, at least in part, in a same layer of semiconductor material as the first waveguide section and the second waveguide section.

(4) The electro-optic transducer of configuration (3), wherein the semiconductor material comprises silicon.

(5) The electro-optic transducer of any one of configurations (2) through (4), wherein the transistor, the first waveguide section, and the second waveguide section are formed on a same complimentary metal-oxide-semiconductor substrate.

(6) The electro-optic transducer of any one of configurations (2) through (4), wherein the transistor is located within 10 microns of the second waveguide section.

(7) A sensor comprising: the electro-optic transducer of any one of configurations (2) through (4); and a sensing electrode coupled to the control terminal of the transistor to sense an electrical signal.

(8) A plurality of the sensors of configuration (7), wherein the first waveguide section is a bus waveguide that couples to each second waveguide section such that a linear density of the sensors is between 10 per millimeter and 50 per millimeter.

(9) The electro-optic transducer of any one of configurations (1) through (8), wherein the second waveguide section comprises a ring resonator.

(10) The electro-optic transducer of configuration (9), wherein the first waveguide section includes a curved portion that evanescently couples the optical radiation to and from the ring resonator.

(11) The electro-optic transducer of configuration (9), wherein the ring resonator includes an impure region of semiconductor material containing an impurity to increase absorption of the optical radiation and thereby increase generation of the free carriers.

(12) The electro-optic transducer of configuration (11), wherein the impure region comprises silicon-germanium.

(13) The electro-optic transducer of any one of configurations (9) through (12), wherein an outer diameter of the ring resonator is no larger than 20 microns.

(14) The electro-optic transducer of any one of configurations (9) through (13), wherein electrical connections to the first region of n-type semiconductor material and the second region of p-type semiconductor material are both on an interior of the ring resonator.

(15) The electro-optic transducer of any one of configurations (1) through (8), wherein the second waveguide section comprises an arm of a Mach-Zehnder interferometer.

(16) A photovoltaic optical modulator comprising: a first waveguide section to guide optical radiation; a second waveguide section optically coupled to the first waveguide section and configured to receive the optical radiation from the first waveguide section; one or more semiconductor junctions formed along the second waveguide section to modulate the optical radiation, wherein: each semiconductor junction comprises a first region of n-type semiconductor material and a second region of p-type semiconductor material; and the optical radiation, when received, generates an amount of free carriers in the second waveguide section that is a majority of a total amount of free carriers provided to the second waveguide section to modulate the optical radiation. The photovoltaic optical modulator further comprises a first transistor having: a first control terminal; and first current-carrying terminals that are connected in parallel to a first portion of the one or more semiconductor junctions and configured to switch the first transistor between providing a short circuit and providing an open circuit between the first region of n-type semiconductor material and the second region of p-type semiconductor material for the first portion of the one or more semiconductor junctions dependent upon a signal applied to the first control terminal, wherein a total capacitance due to interconnection between the first current-carrying terminals and the semiconductor junctions is less than 5 fF.

(17) The photovoltaic optical modulator of configuration 16, further comprising a second transistor having: a second control terminal connected to one of the first current-carrying terminals; and second current-carrying terminals that are connected in parallel to a second portion of the one or more semiconductor junctions and configured to switch the second transistor between providing a short circuit and providing an open circuit between the first region of n-type semiconductor material and the second region of p-type semiconductor material for the second portion of the one or more semiconductor junctions dependent upon a signal applied to the second control terminal.

Different methods of operating a photovoltaic modulator are possible. Some example methods are listed below.

(18) A method of modulating optical radiation, the method comprising: receiving the optical radiation in a first waveguide section; coupling the optical radiation from the first waveguide section to a second waveguide section, the second waveguide section having one or more semiconductor junctions formed in the second waveguide section, wherein each semiconductor junction comprises a first region of n-type semiconductor material and a second region of p-type semiconductor material; and receiving, in the second waveguide section, an amount of free carriers generated by the optical radiation in the second waveguide section, wherein the amount of free carriers is a majority of a total amount of free carriers provided to the second waveguide section to modulate the optical radiation.

(19) The method of (18), further comprising: controlling modulation of the optical radiation with a transistor that has a control terminal and has current-carrying terminals that are connected in parallel to the one or more semiconductor junctions such that the transistor can provide a short circuit or an open circuit between the first region of n-type semiconductor material and the second region of p-type semiconductor material dependent upon a signal applied to the control terminal.

(20) The method of (18) or (19), further comprising biasing the transistor to operate the photonic modulator at modulation speeds greater than 500 MHz.

(21) The method of any one of (18) through (20), further comprising biasing the transistor to operate the photonic modulator at energy levels less than 500 zeptojoules per bit.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the components so conjoined, i.e., components that are conjunctively present in some cases and disjunctively present in other cases. Multiple components listed with "and/or" should be construed in the same fashion, i.e., "one or more" of the components so conjoined. Other components may optionally be present other than the components specifically identified by the "and/or" clause, whether related or unrelated to those components specifically identified. Thus, as a non-limiting example, a reference to "A and/or B", when used in conjunction with open-ended language such as "comprising" can refer, in one embodiment, to A only (optionally including components other than B); in another embodiment, to B only (optionally including components other than A); in yet another embodiment, to both A and B (optionally including other components); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of components, and, optionally, additional unlisted items. Only terms clearly indicated to the contrary, such as "only one of" or "exactly one of," or, when used in the claims, "consisting of," will refer to the inclusion of exactly one component of a number or list of components. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more components, should be understood to mean at least one component selected from any one or more of the components in the list of components, but not necessarily including at least one of each and every component specifically listed within the list of components and not excluding any combinations of components in the list of components. This definition also allows that components may optionally be present other than the components specifically identified within the list of components to which the phrase "at least one" refers, whether related or unrelated to those components specifically identified. Thus, as a non-limiting example, "at least one of A and B" (or, equivalently, "at least one of A or B," or, equivalently "at least one of A and/or B")

can refer, in one embodiment, to at least one, optionally including more than one, A, with no B present (and optionally including components other than B); in another embodiment, to at least one, optionally including more than one, B, with no A present (and optionally including components other than A); in yet another embodiment, to at least one, optionally including more than one, A, and at least one, optionally including more than one, B (and optionally including other components); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An electro-optic transducer comprising:
    a first waveguide section to receive optical radiation; and
    one or more semiconductor junctions formed along a second waveguide section to modulate the optical radiation, wherein the second waveguide section is optically coupled to the first waveguide section and wherein each semiconductor junction comprises a first region of n-type semiconductor material and a second region of p-type semiconductor material, and
    wherein the optical radiation, when received, generates an amount of free carriers in the second waveguide section that is a majority of a total amount of free carriers provided to the second waveguide section to modulate the optical radiation.

2. The electro-optic transducer of claim 1, further comprising:
    a transistor having:
        a control terminal; and
        current-carrying terminals that are connected in parallel to the one or more semiconductor junctions and configured to switch the transistor between providing a short circuit and providing an open circuit between the first region of n-type semiconductor material and the second region of p-type semiconductor material dependent upon a signal applied to the control terminal.

3. The electro-optic transducer of claim 2, wherein the transistor is formed on a same substrate and formed, at least in part, in a same layer of semiconductor material as the first waveguide section and the second waveguide section.

4. The electro-optic transducer of claim 3, wherein the semiconductor material comprises silicon.

5. The electro-optic transducer of claim 2, wherein the transistor, the first waveguide section, and the second waveguide section are formed on a same complimentary metal-oxide-semiconductor substrate.

6. The electro-optic transducer of claim 2, wherein the transistor is located within 10 microns of the second waveguide section.

7. A sensor comprising:
    the electro-optic transducer of claim 2; and
    a sensing electrode coupled to the control terminal of the transistor to sense an electrical signal.

8. A plurality of the sensors of claim 7, wherein the first waveguide section is a bus waveguide that couples to each second waveguide section such that a linear density of the sensors is between 10 per millimeter and 50 per millimeter.

9. The electro-optic transducer of claim 1, wherein the second waveguide section comprises a ring resonator.

10. The electro-optic transducer of claim 9, wherein the first waveguide section includes a curved portion that evanescently couples the optical radiation to and from the ring resonator.

11. The electro-optic transducer of claim 9, wherein the ring resonator includes an impure region of semiconductor material containing an impurity to increase absorption of the optical radiation and thereby increase generation of the free carriers.

12. The electro-optic transducer of claim 11, wherein the impure region comprises silicon-germanium.

13. The electro-optic transducer of claim 9, wherein an outer diameter of the ring resonator is no larger than 20 microns.

14. The electro-optic transducer of claim 9, wherein electrical connections to the first region of n-type semiconductor material and the second region of p-type semiconductor material are both on an interior of the ring resonator.

15. The electro-optic transducer of claim 1, wherein the second waveguide section comprises an arm of a Mach-Zehnder interferometer.

16. A photovoltaic optical modulator comprising:
    a first waveguide section to guide optical radiation;
    a second waveguide section optically coupled to the first waveguide section and configured to receive the optical radiation from the first waveguide section;
    one or more semiconductor junctions formed along the second waveguide section to modulate the optical radiation, wherein:
        each semiconductor junction comprises a first region of n-type semiconductor material and a second region of p-type semiconductor material; and
        the optical radiation, when received, generates an amount of free carriers in the second waveguide section that is a majority of a total amount of free carriers provided to the second waveguide section to modulate the optical radiation; and a first transistor having:
        a first control terminal; and
        first current-carrying terminals that are connected in parallel to a first portion of the one or more semiconductor junctions and configured to switch the first transistor between providing a short circuit and providing an open circuit between the first region of n-type semiconductor material and the second region of p-type semiconductor material for the first portion of the one or more semiconductor junctions dependent upon a signal applied to the first control terminal, wherein a total capacitance due to interconnection between the first current-carrying terminals and the semiconductor junctions is less than 5 fF.

17. The photovoltaic optical modulator of claim 16, further comprising a second transistor having:
    a second control terminal connected to one of the first current-carrying terminals; and
    second current-carrying terminals that are connected in parallel to a second portion of the one or more semiconductor junctions and configured to switch the second transistor between providing a short circuit and providing an open circuit between the first region of n-type semiconductor material and the second region of p-type semiconductor material for the second portion of the one or more semiconductor junctions dependent upon a signal applied to the second control terminal.

18. A method of modulating optical radiation, the method comprising:

receiving the optical radiation in a first waveguide section;

coupling the optical radiation from the first waveguide section to a second waveguide section, the second waveguide section having one or more semiconductor junctions formed in the second waveguide section, wherein each semiconductor junction comprises a first region of n-type semiconductor material and a second region of p-type semiconductor material; and receiving, in the second waveguide section, an amount of free carriers generated by the optical radiation in the second waveguide section, wherein the amount of free carriers is a majority of a total amount of free carriers provided to the second waveguide section to modulate the optical radiation.

19. The method of claim 18, further comprising:

controlling modulation of the optical radiation with a transistor that has a control terminal and has current-carrying terminals that are connected in parallel to the one or more semiconductor junctions such that the transistor can provide a short circuit or an open circuit between the first region of n-type semiconductor material and the second region of p-type semiconductor material dependent upon a signal applied to the control terminal.

20. The method of claim 19, further comprising biasing the transistor to modulate the optical radiation at modulation speeds greater than 500 MHz.

21. The method of claim 19, further comprising biasing the transistor to modulate the optical radiation with energy levels less than 500 zeptojoules per bit.

* * * * *